United States Patent
Brcka et al.

(10) Patent No.: US 7,749,398 B2
(45) Date of Patent: Jul. 6, 2010

(54) SELECTIVE-REDEPOSITION SOURCES FOR CALIBRATING A PLASMA PROCESS

(75) Inventors: Jozef Brcka, Loudonville, NY (US); Rodney L. Robison, East Berne, NY (US); Takashi Horiuchi, Kai (JP)

(73) Assignee: Tokyo Electron Limited, Tokyo (JP)

( * ) Notice: Subject to any disclaimer, the term of this patent is extended or adjusted under 35 U.S.C. 154(b) by 950 days.

(21) Appl. No.: 11/536,758

(22) Filed: Sep. 29, 2006

(65) Prior Publication Data
US 2008/0087638 A1 Apr. 17, 2008

(51) Int. Cl.
*H01L 21/302* (2006.01)
(52) U.S. Cl. .............................. 216/41; 216/59; 438/5; 438/9; 438/14; 438/689; 438/700; 257/48
(58) Field of Classification Search ..................... None
See application file for complete search history.

(56) References Cited

U.S. PATENT DOCUMENTS

| | | | |
|---|---|---|---|
| 5,520,769 A * | 5/1996 | Barrett et al. ................. 438/14 |
| 5,578,161 A * | 11/1996 | Auda ............................. 438/9 |
| 5,688,358 A | 11/1997 | Tanaka et al. | |
| 5,986,874 A | 11/1999 | Ross et al. | |
| 6,039,836 A | 3/2000 | Dhindsa et al. | |
| 6,042,686 A | 3/2000 | Dible et al. | |
| 6,080,287 A | 6/2000 | Drewery et al. | |
| 6,132,564 A | 10/2000 | Licata | |
| 6,197,165 B1 | 3/2001 | Drewery et al. | |
| 6,267,839 B1 | 7/2001 | Shamouilian et al. | |
| 6,287,435 B1 | 9/2001 | Drewery et al. | |
| 6,431,112 B1 | 8/2002 | Sill et al. | |
| 6,608,690 B2 | 8/2003 | Niu et al. | |
| 6,689,249 B2 | 2/2004 | Ke et al. | |
| 6,719,886 B2 | 4/2004 | Drewery et al. | |
| 6,755,945 B2 | 6/2004 | Yasar et al. | |
| 6,759,253 B2 * | 7/2004 | Usui et al. ..................... 438/6 |
| 6,768,983 B1 | 7/2004 | Jakatdar et al. | |
| 6,785,638 B2 | 8/2004 | Niu et al. | |
| 6,839,145 B2 | 1/2005 | Niu et al. | |
| 7,072,049 B2 | 7/2006 | Niu et al. | |
| 7,629,255 B2 * | 12/2009 | Fu et al. ..................... 438/672 |
| 2002/0004309 A1 | 1/2002 | Collins et al. | |
| 2004/0017574 A1 | 1/2004 | Vuong et al. | |
| 2005/0103444 A1 | 5/2005 | Brcka | |
| 2005/0103445 A1 | 5/2005 | Bcka et al. | |
| 2007/0114449 A1 * | 5/2007 | Nakayama ............... 250/491.1 |

OTHER PUBLICATIONS

Kinoshita, S. et al "Calibration Method for High-Density-Plasma Chemical Vapor Deposition Simulation" JJAP 41, 1974-1980, Part I, No. 4A, Apr. 2002.*
Jozef Brcka, Segmented Biased Peripheral Electrode in Plasma Processing Method and Apparatus, U.S. Appl. No. 11/196,557, filed Aug. 3, 2005.
Jozef Brcka et al., Selective-Redeposition Structures for Calibrating a Plasma Process, U.S. Appl. No. 11/536,902, filed Sep. 26, 2006.

* cited by examiner

*Primary Examiner*—Anita K Alanko
(74) *Attorney, Agent, or Firm*—Wood, Herron & Evans, LLP

(57) ABSTRACT

Calibration wafers and methods for calibrating a plasma process performed in a plasma processing apparatus, such as an ionized physical vapor deposition apparatus. The calibration wafer includes one or more selective-redeposition sources that may be used for calibrating a plasma process. The selective-redeposition sources are constructed to promote the redeposition of a controllable and/or measurable amount of material during the plasma process.

35 Claims, 8 Drawing Sheets

SELECTIVE-REDEPOSITION SOURCES FOR CALIBRATING A PLASMA PROCESS

FIELD OF THE INVENTION

This invention relates generally to the field of semiconductor fabrication and, more particularly, to methods for determining actual etch and redeposition rates in connection with the plasma processing of semiconductor integrated circuits and calibration wafers for use in the methods.

BACKGROUND OF THE INVENTION

Ionized physical vapor deposition is a technique used to deposit films, typically of metal or metal compounds, on semiconductor wafers during the fabrication of semiconductor devices. Ionized physical vapor deposition is advantageous for metallization of high aspect ratio vias and trenches extending into semiconductor wafers. In particular, ionized physical vapor deposition provides excellent sidewall and bottom coverage for vias and trenches.

In ionized physical vapor deposition, a metal target is mounted within a vacuum chamber and biased with a negative voltage relative to the grounded metal walls of the vacuum chamber. A sputtering gas, such as argon, is flowed into the vacuum chamber. The negative voltage on the target excites the sputtering gas proximate to the target into a plasma state and accelerates ions from the plasma to bombard an exposed surface of the target. The ion bombardment sputters metal atoms from the target that are ejected with a distribution of angular trajectories. A semiconductor wafer is held in the vacuum chamber near, and parallel to, the target. A relatively high-density plasma is generated in a region of the vacuum chamber between the target and the semiconductor wafer. The plasma ionizes a large proportion of the metal atoms ejected from the target, which are thermalized in the plasma. The semiconductor wafer is also negatively biased relative to the electrically grounded metal walls of the chamber, which accelerates the ionized sputtered target atoms from the plasma toward the semiconductor wafer. The target atoms impact the semiconductor wafer with more perpendicular trajectories than characteristic of non-ionized sputtering, which greatly increases the amount of material deposited at the bottom of high aspect ratio vias and trenches.

Etching of the metal film forming on the surface of the wafer, which occurs concurrently with the metal film's deposition, is an important component of the ionized physical vapor deposition process. Operating pressures of tens of mTorr are required in the vacuum chamber of the ionized physical vapor deposition apparatus to permit the material to thermalize in the plasma. At low chamber pressures (e.g., <30 mTorr), metal sputter etched from the surface of the semiconductor wafer has a large thermalization length (e.g., 100 mm to 200 mm). A portion of the sputter etched metal will return to the wafer surface and be reincorporated into the forming metal film as redeposited material. The rate of redeposition is influenced by the chamber pressure. At low chamber pressures, only a small fraction of the sputter etched metal will return back to the surface because of the large thermalization length. Hence, redeposition is negligible in comparison to the etch rate.

As the chamber pressure increases, the density of the various species in the plasma likewise increases. The mean-free-path of the metal atoms sputter etched from the metal film becomes small in comparison to the dimensions of the vacuum chamber, so that randomization occurs due to collisions and gas scattering of sputter etched metal. As a result, the thermalization length for the sputter etched metal drops. At chamber pressures greater than 30 mTorr, redeposition of the sputter etched metal has a significant impact on the etch rate of the metal film.

In particular, the thermalization length required for atoms sputtered from metal film at a kinetic energy of several electron volts to reach a kinetic energy on the order of 0.1 eV to 0.2 eV is on the order of 15 mm or less at these pressures. Measured etch rates are influenced by the redeposited sputter etched metal in a manner that cannot be reliably ascertained. Consequently, because of the significance of the redeposition, the actual etch rate at higher chamber pressures cannot be accurately evaluated in an ionized physical vapor deposition apparatus using conventional calibration wafers.

Moreover, the amount of redeposition experienced by the substrate surface as the metal film is deposited may exhibit a significant radial dependence relative to the azimuthal centerline of the substrate. In other words, a region of the substrate near the substrate edge may experience a reduced redeposition rate than a region of the substrate located near the substrate center. The radial dependence may change dramatically with a relatively minor change in the chamber pressure. As a result, the ability to measure the actual etch rate is not only impacted by the redeposition process but may also exhibit a dependence based upon the position on the substrate surface. Conventional calibration wafers are unable to evaluate this position dependent behavior of the actual etch rate in an ionized physical vapor deposition apparatus.

There is thus a need for a calibration wafer and method that can measure actual etch rates in an ionized physical vapor deposition apparatus at chamber pressures characterized by a short thermalization length.

SUMMARY OF THE INVENTION

In one embodiment of the invention, a calibration wafer is provided for determining an actual etch rate of an etchable material, which is capable of redepositing onto the calibration wafer after being etched by a plasma from the calibration wafer. The calibration wafer comprises a continuous first layer of a first material on a carrier substrate and a patterned second layer of a second material on the first layer. The second layer comprises at least one discrete raised region of the second material bordering at least one discrete recessed region of the first material. One of the first and second materials is the etchable material, which has a number of selective-redeposition sources defined by the at least one discrete raised region or by the at least one discrete recessed region. A first amount of the etchable material is capable of being etched from each of the selective-redeposition sources upon etching by the plasma. The number of selective-redeposition sources, a minimum separation distance between adjacent selective-redeposition sources, and a maximum surface area of each of the selective-redeposition sources are chosen such that a second amount of the etchable material that is capable of being redeposited on each of the selective-redeposition sources, upon etching by the plasma, is less than about three percent of the first amount etched from each of the respective selective-redeposition sources.

In another embodiment of the invention, a method is provided for fabricating a calibration wafer for use in determining an actual etch rate of an etchable material. The method comprises forming a number of selective-redeposition sources of the etchable material on a carrier substrate. A first amount of the etchable material is capable of being etched by a plasma from each of the selective-redeposition sources. A second amount of the etchable material is capable of redepositing onto each of the selective-redeposition sources while the first amount is etched. The method further comprises selecting a number of the selective-redeposition sources, a minimum separation distance between adjacent selective-redeposition sources, and a maximum surface area of each of the selective-redeposition sources such that the second amount of the etchable material is predicted to be about three percent or less of the first amount.

In yet another embodiment of the invention, a method is provided for determining an actual etch rate of an etchable material. The method comprises providing a calibration wafer carrying a layer of the etchable material and determining an initial thickness of the layer of the etchable material before etching. The layer of the etchable material has a number of selective-redeposition sources, a minimum separation distance between adjacent selective-redeposition sources, and a maximum surface area for each of the selective-redeposition sources. The method further comprises etching a first amount of the etchable material from each of the selective-redeposition sources over a plasma exposure time and determining a final thickness of the layer of the etchable material underlying at least one of the selective-redeposition sources after etching. The number, the minimum separation distance, and the maximum surface area are chosen such that a second amount of the etchable material that redeposits on each of the respective selective-redeposition sources is less than about three percent of the first amount. The method further comprises determining the actual etch rate of the etchable material from the initial and final thicknesses and the plasma exposure time.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention where.

DETAILED DESCRIPTION

Figure 1:
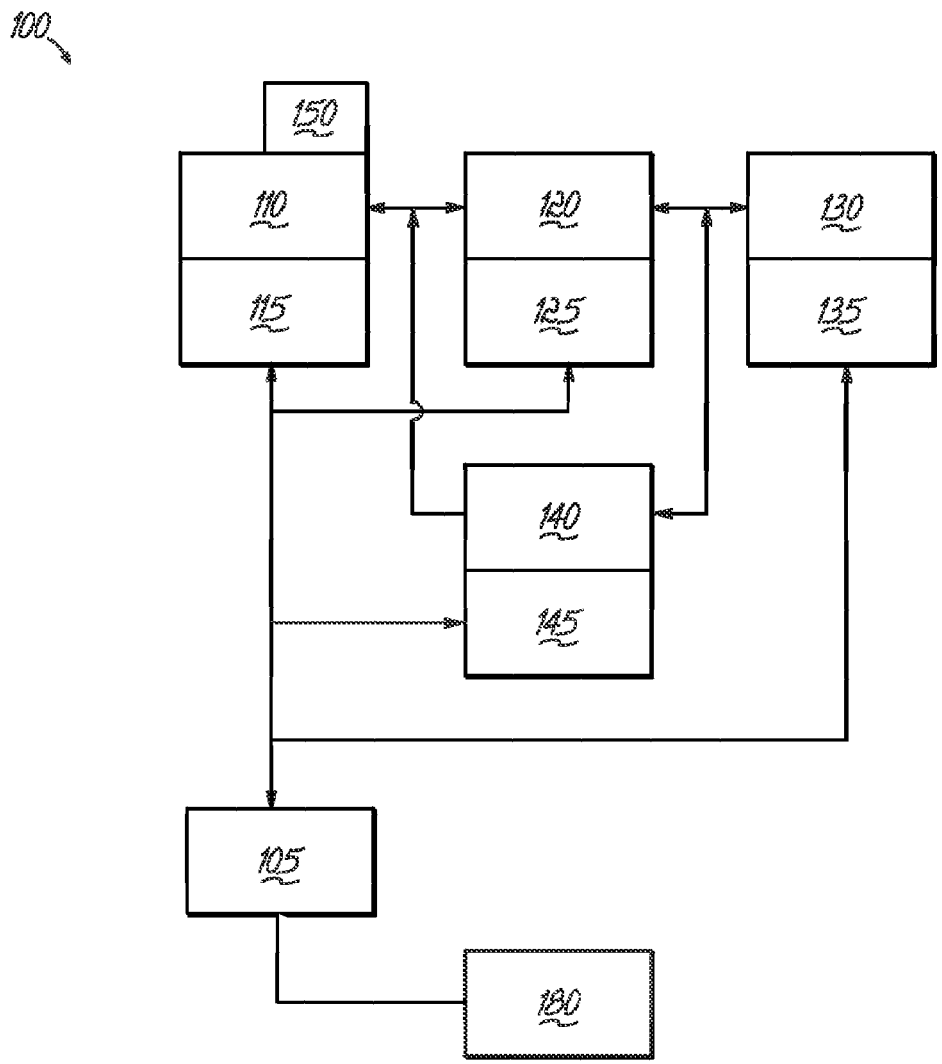
FIG. 1 shows an exemplary block diagram of a processing system in accordance with embodiments of the invention.

With reference to FIG. 1, a processing system 100 comprises a lithography subsystem 110, a transfer subsystem 120, a processing subsystem 130, and a metrology subsystem 140. The lithography subsystem 110, the transfer subsystem 120, the processing subsystem 130, and the metrology subsystem 140 can be coupled to each other. The system 100 can include a system controller 105, the lithography subsystem 110 can include a controller 115, the transfer subsystem 120 can include a controller 125, the processing subsystem 130 can include a controller 135, and the metrology subsystem 140 can include a controller 145, and the controllers (105, 115, 125, 135, and 145) can be coupled to each other. In addition, a scanner 150 can be coupled to the lithography subsystem 110, or alternatively, the lithography system 110 may include a scanning system.

A manufacturing equipment system (MES) system 180 can be coupled to the system controller 105. Alternatively other configurations may be used and other coupling techniques may be used.

One or more of the subsystems of the processing system 100 can comprise a control component, a GUI component, and/or a database component (not shown). In alternate embodiments, one or more additional subsystems may be required.

Some setup and/or configuration information can be obtained by one or more of the controllers (105, 115, 125, 135, and 145) from the factory system (MES) 180. Factory level business rules can be used to establish a control hierarchy. Business rules can be used to specify the action taken for normal processing and the actions taken on error conditions. Also, factory level business rules can be used to determine when a process is paused and/or stopped, and what is done when a process is paused and/or stopped. In addition, factory level business rules can be used to determine when to change a process and how to change the process.

Business rules can be defined at a control strategy level, a control plan level or a control model level. Business rules can be assigned to execute whenever a particular context is encountered. When a matching context is encountered at a higher level as well as a lower level, the business rules associated with the higher level can be executed. GUI screens can be used for defining and maintaining the business rules. Business rule definition and assignment can be allowed for users with greater than normal security level. The business rules can be maintained in the database. Documentation and help screens can be provided on how to define, assign, and maintain the business rules.

The MES 180 can be configured to monitor some system processes using data reported from by one or more of the controllers (105, 115, 125, 135, and 145). Factory level business rules can be used to determine which processes are monitored and which data is used. For example, the controllers (105, 115, 125, 135, and 145) can independently collect data, or the data collection process can be controlled to some degree by the factory system 180. Also, factory level business rules can be used to determine how to manage the data when a process is changed, paused, and/or stopped. In addition, the MES 180 can provide run-time configuration information to one or more of the controllers (105, 115, 125, 135, and 145). Data can be exchanged using GEM SECS communications protocol.

In general, rules allow system and/or tool operation to change based on the dynamic state of the processing system 100 and/or the processing state of a product. Some setup and/or configuration information can be determined by the processing system subsystems when they are initially configured. In addition, rules can be used to establish a control hierarchy at the system/tool level. Rules can be used to determine when a process is paused and/or stopped, and what is done when a process is paused and/or stopped. In addition, rules can be used to determine what corrective actions are to be performed, such as when to change a process, how to change the process, and how to manage the data.

In FIG. 1, single subsystems are shown, but this is not required for the invention. The processing system 100 can comprise a different number of processing subsystems having any number of controllers associated with them in addition to other types of processing tools and modules. Processing subsystem 130 can include one or more etch modules, deposition modules, ALD modules, measurement modules, polishing modules, coating modules, developing modules, cleaning modules, and thermal treatment modules.

The system 100 can comprise an APC system that can interface with processing tools from Tokyo Electron Limited (TEL), such as a Unity Tool, a Telius Tool and/or a Trias Tool and their associated processing subsystems and process modules. In addition, the system 100 can comprise one or more run-to-run (R2R) controllers. For example, the processing system 100 can include a processing system from TEL, and one or more controllers such as a group level controller (i.e. an INGENIO™ GL controller from Tokyo Electron Limited), a tool level controller (i.e. an INGENIO™ controller from Tokyo Electron Limited), and a measurement analysis controller (i.e. a Profiler™ Application Server (PAS) from Timbre Technologies, Inc a TEL company). In addition, the metrology subsystem 140 can comprise an integrated optical digital profilometry (iODP) system from Timbre Technologies, Inc.

One or more of the controllers (105, 115, 125, 135, and 145) can include GUI components (not shown) can provide easy to use interfaces that enable users to: view status; create/view/edit strategies, plans, errors, faults, databases, rules, recipes, modeling applications, simulation/spreadsheet applications, email messages, and diagnostics screens. As should be apparent to those skilled in the art, the GUI components need not provide interfaces for all functions, and may provide interfaces for any subset of these functions or others not listed here.

One or more of the controllers (105, 115, 125, 135, and 145) can include memory components (not shown) that can include one or more computer-readable storage media. Operational data, process data, library data, and/or computer executable code can be stored in memory components. Data collection plans can be used to control the data that is collected as well as when data is collected.

One or more of the controllers (105, 115, 125, 135, and 145) can include Fault Detection and Classification (FDC) applications, and they can exchange FDC information with each other and/or the MES 180. Rules can be used in Fault Detection and Classification (FDC) applications to determine how to respond to alarm conditions, error conditions, fault conditions, and/or warning conditions. In addition, the MES 180 can send command and/or override information to one or more of the controllers (105, 115, 125, 135, and 145). One or more FDC applications can be running at the same time and can send and/or receive information concerning an alarm/error/fault condition. For example, FDC information can be exchanged via an e-Diagnostics network, e-mail, or personal communication devices. For example, an alarm/error/fault condition can be established, and a message can be sent to pause the current process or to stop the current process when a limit is reached or exceeded, or when a product requirement is not met, or when a corrective action is required.

The subsystems (110, 120, 130, and 140) can control multiple processing applications and/or models that are executed at the same time and are subject to different sets of process constraints. For example, a controller can run in three different modes: simulation mode, test mode, and standard mode. A controller can operate in simulation mode in parallel with the actual process mode. In addition, FDC applications can be run in real-time and produce real-time accuracy improvement faults and/or errors. Furthermore, FDC applications can be run in a simulation mode and produce predicted accuracy improvement faults and/or errors.

The FDC system can detect faults, predict system performance, predict preventative maintenance schedules, decrease maintenance downtime, and extend the service life of consumable parts in the system. The interfaces to the FDC system can be web-enabled and can provide a real time FDC status display.

The subsystems (110, 120, 130, and 140) and/or the processing system 100 can take various actions in response to an alarm/fault, depending on the nature of the alarm/fault. The actions taken on the alarm/fault can be context-based, and the context can be specified by a rule, a system/process recipe, a module type, module identification number, load port number, cassette number, lot number, control job ID, process job ID, slot number and/or the type of data.

The controllers (105, 115, 125, 135, and 145) can exchange information with each other and/or with the MES 180. The information can include measurement data, process data, historical data, feed-forward data, and/or feedback data. Furthermore, the MES 180 can be used to provide measurement data, such as CD SEM information. Alternately, the CD SEM information can be provided using a system controller. CD SEM information can include adjustment factors and timestamp data that can be used to adjust for any offset between the system measurement tools and external measurement tools. For example, the external measurement tools may include a CD-Scanning Electron Microscopy (CDSEM) tool, a Transmission Electron Microscopy (TEM) tool, a focused ion beam (FIB) tool, or another optical metrology tool.

One or more control applications can be used to compute a predicted state for the wafer based on the input state, the process characteristics, and a process model. An etch rate model can be used along with a processing time to compute an etch depth, and a deposition rate model can be used along with a processing time to compute a deposition thickness. For example, models can include EM models, SPC charts, PLS models, PCA models, FDC models, and Multivariate Analysis (MVA) models. A control application can operate in a simulation mode, a test mode, and a standard mode.

The processing system 100 can provide wafer sampling and the wafer slot selection can be determined using a (PJ Create) function. The R2R control configuration can include, among other variables, feed forward control plan variables, feedback control plan variables, metrology calibration parameters, control limits, and SEMI Standard variable parameters. Metrology data reports can include wafer, site, structure, and composition data, among others, and the tool can report actual settings for the wafer The metrology subsystem 140 can include an Optical Digital Profiling (ODP) system (not shown). An ODP tool is available from Timbre Technologies Inc. (a TEL company) that provides a patented technique for measuring the profile of a structure in a semiconductor device. For example, ODP techniques can be used to obtain critical dimension (CD) information, structure profile information, or via profile information, and the wavelength ranges for an ODP system can range from 200 nm to 900 nm.

The metrology subsystem 140 can use polarizing reflectometry, spectroscopic ellipsometry, reflectometry, or other optical measurement techniques to measure true device profiles, accurate critical dimensions (CD), and multiple layer film thickness of a wafer. The process is executed in-line, which eliminates the need to break the wafer for performing the analyses. ODP techniques can be used with the existing thin film metrology tools for inline profile and CD measurement, and can be integrated with TEL processing tool and/or lithography system s to provide real-time process monitoring and control. An ODP™solution has three key components: ODP™ Profiler™ Library comprises an application specific database of optical spectra and its corresponding semiconductor profiles, CDs, and film thicknesses. Profiler™ Application Server (PAS) comprises a computer server that connects with optical hardware and computer network. It handles the data communication, ODP library operation, measurement process, results generation, results analysis, and results output. The ODP™ Profiler™ Software includes the software installed on PAS to manage measurement recipe, ODP™ Profiler™ library, ODP™ Profiler™ data, ODP™ Profiler™ results search/match, ODP™ Profiler™ results calculation/analysis, data communication, and PAS interface to various metrology tools and computer network.

An exemplary optical metrology system is described in co-pending U.S. patent application Ser. No. 09/727,530 entitled "System and Method for Real-Time Library Generation of Grating Profiles" by Jakatdar, et al., filed on Nov. 28, 2000; the disclosure of which hereby is incorporated by reference herein in its entirety.

ODP techniques can be used to measure the presence and/or thickness of coatings on wafers and/or materials within features and/or structures of a patterned wafer. These techniques are taught in co-pending U.S. patent application Ser. No. 10/357,705, entitled "Model Optimization for Structures with Additional Materials" by Niu, et al., filed on Feb. 3, 2003, and ODP techniques covering the measurement of additional materials are taught in U.S. Pat. No. 6,608,690, entitled "Optical Profilometry of Additional-material Deviations in a Periodic Grating", filed on Dec. 4, 2001, and in U.S. Pat. No. 6,839,145, entitled "Optical Profilometry of Additional-material Deviations in a Periodic Grating", filed on May 5, 2003. The disclosure of each of these patent documents is incorporated by reference herein in its entirety.

ODP techniques for creating a metrology model are taught in co-pending U.S. patent application Ser. No. 10/206,491, entitled "Model and Parameter Selection in Optical Metrology" by Voung, et al., filed on Jul. 25, 2002 and ODP techniques covering integrated metrology applications are taught in U.S. Pat. No. 6,785,638, entitled METHOD AND SYSTEM OF DYNAMIC LEARNING THROUGH A REGRESSION-BASED LIBRARY GENERATION PROCESS, filed on Aug. 6, 2001. The disclosure of each of these patent documents is incorporated by reference herein in its entirety.

Recipes can be organized in a tree structure that can comprise recipe sets, classes, and recipes that can be displayed as objects. Recipes can include process recipe data, system recipe data, and IMM recipe data. IMM recipes can contain pattern recognition information, can be used to identify the chips to sample on each wafer, and can be used to determine which PAS recipe to use. PAS recipes can be used to determine which ODP library to use, and to define the measurement metrics to report, such as top CD, bottom CD, side wall angle (SWA), layer thicknesses, trench width, and goodness of fit (GOF).

Processing system 100 can include Advanced Process Control (APC) applications that can operate as control strategies, control plans, control models, and/or recipe managers to provide run-to-run (R2R) processing. For example, wafer level context matching at runtime allows for custom configuration by wafer (slot, waferID, lotID, etc.). In addition, feed forward and/or feedback control can be implemented by configuring control strategies, control plans, and control models. A Control Strategy can be written for each system process where feed forward and/or feedback control is implemented. When a strategy is protected, all of its child objects (plans and models) cannot be edited. When a system recipe executes, one or more of the Control Plans within the Control Strategy can be executed. Each control plan can be used to modify the recipe based on feed-forward and/or feedback information.

Control plans can cover multiple process steps within a process, and can be used to analyze the collected data, and establish error conditions. An analysis application can be executed when a context is matched. During the execution of an analysis application, one or more analysis plans can be executed. A plan can create an error when a data failure occurs, an execution problem occurs, or a control problem occurs. When an error occurs, the plan can generate an alarm message; the parent strategy status can be changed to a failed status; the plan status can be changed to a failed status; and one or more messages can be sent to the alarm log and the FDC system. When a feed forward plan or a feedback plan fails, one or more of the plans in the parent strategy may be terminated, and their status can be changed to a failed status. In one case, when a bad incoming wafer is detected, a control plan can detect and/or identify this as a faulty incoming wafer. In addition, when a feedback plan is enabled, the feedback plan can skip a wafer that has been identified to be defective and/or faulty by another plan. A data collection plan can reject the data at all the measurement sites for this wafer or reject the data because an accuracy improvement procedure fails to meet the required accuracy limits.

In one embodiment, feedback plan failure may not terminate the strategy or other plans, and a calibration procedure failure may also not terminate the strategy or other plans. Successful plans, strategies, and/or calibration procedures do not create any error/alarm messages. Pre-specified failure actions for strategy and/or plan errors can be stored in a database, and can be retrieved from the database when an error occurs. Failure actions can include use the nominal process recipe for this wafer or use a null process recipe for this wafer. A null recipe can be a control recipe that is used by a processing tool and/or processing system to allow a wafer to pass through and/or remain in a processing chamber without processing. For example, a null recipe can be used when a processing tool is paused or when a wafer does not require processing.

Process verification procedures and/or process model updates can be performed by running calibration/monitor wafers, varying the process settings and observing the results, then updating the process and/or models. For example, an update can take place every N processing hours by measuring the before and after characteristics of a calibration/monitor wafer. By changing the settings over time to check different operating regions one could validate the complete operating space over time, or run several calibration/monitor wafers at once with different recipe settings. The update procedure can take place at a tool level, at a system level, or at the factory level.

An updated calibration recipe and/or updated calibration model can be calculated at different times based on the wafer context and can be based on a product requirement. For example, feed-forward information, modeling information, and/or feedback information can be used to determine whether or not to change the current recipe before running the current wafer, before running the next wafer, or before running the next lot.

Figure 2:
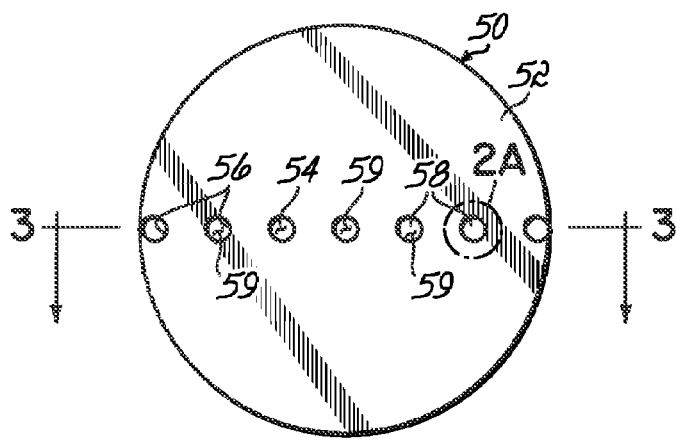
FIG. 2 illustrates a diagrammatic top view of a calibration wafer in accordance with an embodiment of the invention.
Figure 2A:
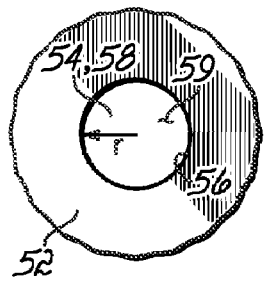
FIG. 2A is a view of a portion of the calibration wafer of FIG. 2.
Figure 3:
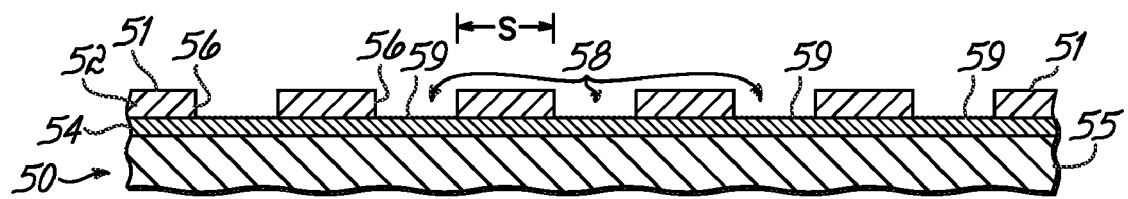
FIG. 3 illustrates an enlarged view in partial cross-section of a portion of the calibration wafer of FIG. 2.

With reference to FIGS. 2, 2A, and 3, a calibration wafer 50 includes a continuous layer 54 of a first material on a carrier substrate 55 and an overlying patterned layer 52 of a second material that partially masks layer 54. Openings 56 are defined in layer 52 to create a number or plurality of selective-redeposition sources 58 by exposing a plurality of regions of layer 54. Each of the selective-redeposition sources 58 may comprise a discrete exposed surface 59 of a respective one of the exposed regions of layer 54. A top surface 51 of layer 52 is raised relative to the level of layer 54 and the exposed surface 59 of each of the selective-redeposition sources 58 is recessed relative to the level of the top surface 54 of layer 52. The un-masked regions 56 are distributed at various locations across the surface of calibration wafer 50, while the remainder of layer 54 is masked by the second material of layer 52. Layer 54 defines a flat field region about the exposed surfaces 59. Carrier substrate 55 may be a round silicon wafer having a diameter of 200 mm, 300 mm, etc. Layer 52 masks the majority of the surface area of wafer 50.

In this embodiment, the first material in layer 54 comprises the etchable material of the calibration wafer 50. The surface area of each selective-redeposition source 58 will depend upon the specific geometrical shape of the exposed surface 59. As best shown in FIG. 2A, each of the selective-redeposition sources 58 in the representative round embodiment has a surface area proportional to the square of the radius, r. In addition, adjacent selective-redeposition sources 58 are separated by a separation distance, s. A first amount of the etchable material of layer 54 is capable of being etched from each of the selective-redeposition sources 58 upon etching by the plasma. The number of selective-redeposition sources 58, a minimum separation distance between adjacent selective-redeposition sources 58, and a maximum surface area of each of the selective-redeposition sources 58 are selected such that a second amount of the etchable material that is capable of being redeposited on each of the selective-redeposition sources 58, upon etching by the plasma, may be less than about three percent of the first amount etched from each of the respective selective-redeposition sources 58. Alternatively, these parameters may be selected such that a second amount of the etchable material that is capable of being redeposited on each of the selective-redeposition sources 58, upon etching by the plasma, may be less than about one half of one percent of the first amount etched from each of the respective selective-redeposition sources 58.

In an alternate embodiment, the calibration wafer may also include one or more selective-redeposition structures as described in co-pending patent application Ser. No. 11/536,902 and entitled "Selective-Redeposition Structures for Calibrating a Plasma Process"), which is hereby incorporated by reference herein in its entirety.

Figure 4:
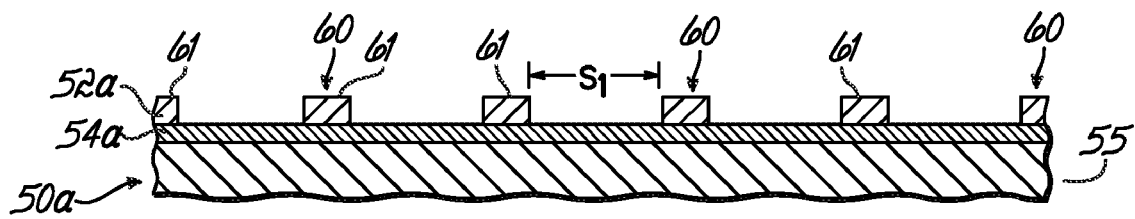
FIG. 4 illustrates an enlarged view of an alternate embodiment in partial cross-section of the calibration wafer of FIG. 2.

With reference to FIG. 4 in which like reference numerals refer to like features in FIG. 3 and in accordance with an alternative embodiment of the invention, a calibration wafer 50a includes a continuous layer 54a of the first material on the carrier substrate 55 and a plurality of selective-redeposition sources 60 defined by a patterned layer 52a of the second material on layer 54a. The selective-redeposition sources 60 may comprise an exposed surface 61 of each of the exposed regions of the patterned layer 52a. The exposed surface 61 of each of the selective-redeposition sources 60 is raised relative to the level of layer 54a and portions of layer 54a between adjacent exposed surfaces 61 are recessed relative to the level of the exposed surfaces 61 of layer 52a. Portions of the second material of layer 52a separate adjacent selective-redeposition sources 60. The characteristics of the selective-redeposition sources 60 of the first material are selected as described above with regard to the selective-redeposition sources 58 (FIG. 3).

In this embodiment, the second material in layer 52a comprises the etchable material of the calibration wafer 50a. The surface area of each selective-redeposition source 60 will depend upon the specific geometrical shape of the exposed surface 61, as described above with regard to selective-redeposition sources 58 (FIGS. 2, 2A, 3). A separation distance, s1, separates adjacent selective-redeposition sources 60. A first amount of the etchable material of layer 52a is capable of being etched from each of the selective-redeposition sources 60 upon etching by the plasma. The number of selective-redeposition sources 60, a minimum separation distance, s1, between adjacent selective-redeposition sources 60, and a maximum surface area of each of the selective-redeposition sources 60 are selected such that a second amount of the etchable material that is capable of being redeposited on each of the selective-redeposition sources 60, upon etching by the plasma, may be less than about three percent of the first amount etched from each of the respective selective-redeposition sources 60. Alternatively, these parameters may be selected such that a second amount of the etchable material that is capable of being redeposited on each of the selective-redeposition sources 60, upon etching by the plasma, may be less than about one half of one percent of the first amount etched from each of the respective selective-redeposition sources 60.

Any of the calibration wafers described herein may be constructed with the continuous layer or the patterned layer operating as the selective-redeposition sources 58 (FIGS. 2, 2A, 3) or 60 (FIG. 4).

Figure 5:
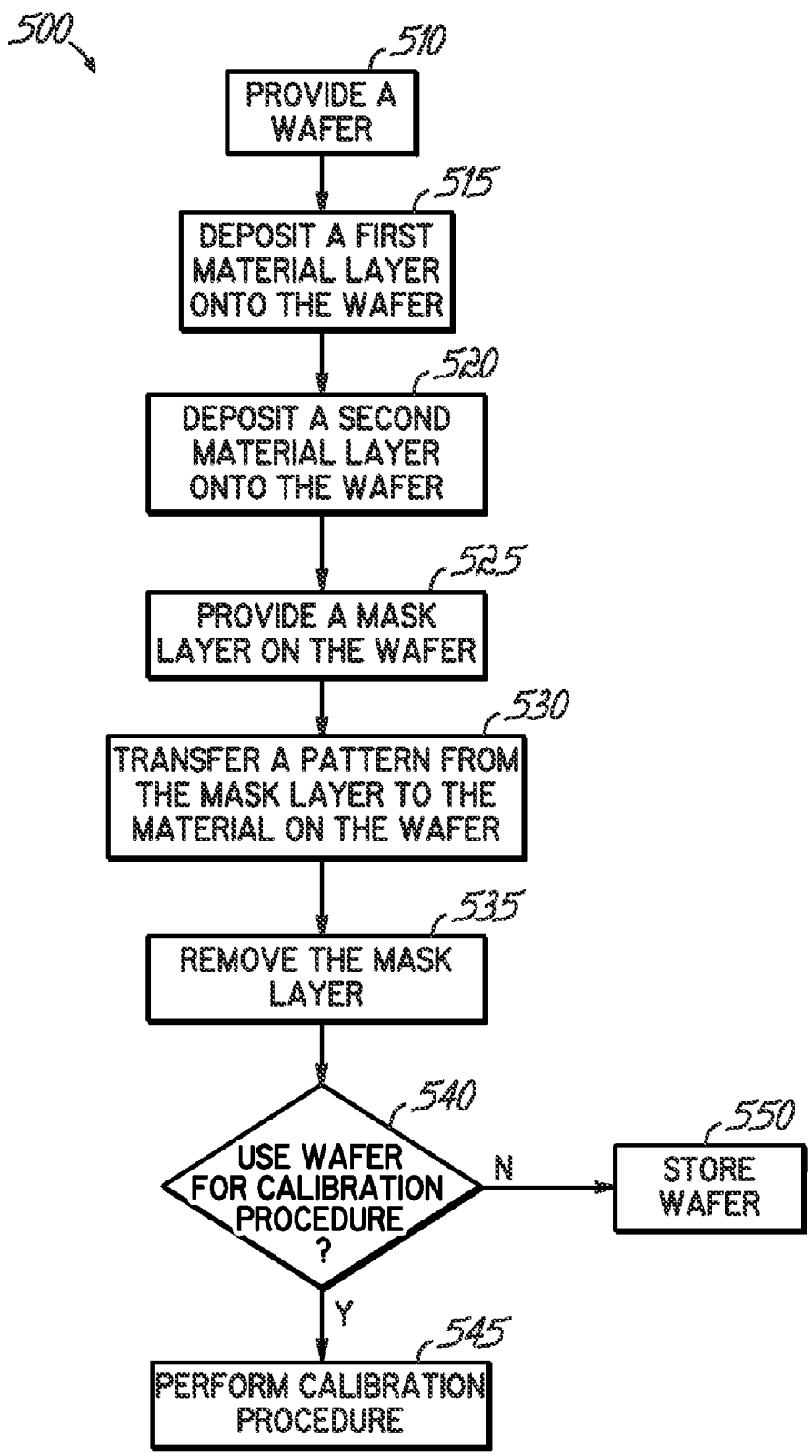
FIG. 5 shows an exemplary flow diagram of a wafer fabrication process in accordance with embodiments of the invention.

FIG. 5 shows an exemplary flow diagram of a wafer fabrication process in accordance with embodiments of the invention. In the illustrated embodiment, a procedure 500 is shown for a calibration wafer. In task 510, a calibration wafer is provided to a processing system such as system 100 (FIG. 1). In one embodiment, the selective-redeposition sources 58 of the calibration wafer 50 may be created by forming openings 56 in the second material of layer 52 (FIGS. 2, 3) using a conventional lithography and etch process. Alternatively, other lithography procedures and/or etch processes may be used.

In task 515, a first material layer 54 is deposited on the carrier substrate 55. The first material layer 54 may be deposited using a chemical vapor deposition (CVD) process, plasma-enhanced chemical vapor deposition (PECVD) process, physical vapor deposition (PVD) process, ionized physical vapor deposition (IPVD) process, atomic layer deposition (ALD) process, or a plasma-enhanced atomic layer deposition (PEALD) process, or a combination thereof. The first material layer 54 may include copper, tantalum, aluminum, nickel, cobalt, ruthenium, gold, silver, or titanium, or a combination thereof. Alternatively, the first material layer 54 may include oxides, or nitrides, or a combination thereof. The carrier substrate 55 may include semiconductor material, dielectric material, metallic material, planarization material, or insulating material, or a combination thereof.

In task 520, the second material layer 52 is deposited on the first material layer 54. The second material layer 52 may be deposited using a CVD process, a PECVD process, a PVD process, an IPVD process, an ALD process, or a PEALD process, or a combination thereof. The second material layer may include a material that is different than the material used in the first material layer 52. For example, the etch rate for the second material may be substantially lower than the etch rate for the material used in the first material layer 52. The material layer 54 may include oxides, or nitrides, or a combination thereof. Alternatively, the material layer 54 may include copper, tantalum, aluminum, nickel, cobalt, ruthenium, gold, silver, or titanium, or a combination thereof. Alternatively, the etch rate for the second material may be equal to, or may be substantially higher than, the etch rate for the material used in the first material layer 52.

In task 525, a mask layer (not shown) is provided on the second material layer 52. In one embodiment, a resist (not shown) may be deposited on the second material layer 52. Alternatively, other materials such anti-reflective coating (ARC) material may also be used. The resist is exposed to a pattern of radiation to impart a latent image characteristic of the arrangement of the selective-redeposition sources 58 and subsequently developed. Other approaches may be used to form the patterned etch mask on the second material layer 52.

In task 530, the pattern from the mask layer is transferred to the second material layer 52. In one embodiment, the exposed pattern is transferred from the resist to the second material layer 52 using the patterned resist as an etch mask for a directional anisotropic dry etching process, such as a reactive-ion etching (RIE) process or a plasma etching process. Alternatively, a wet-etching process may be used. The etching process removes the material in regions of the second material layer 52 exposed through the patterned resist. In one embodiment, the etching process may be timed and the resist pattern may be chosen to provide a predetermined aspect ratio for the selective-redeposition sources 58. Alternatively, an end point detection process or an etch stop material may be used to halt the etching process.

In task 535, the remaining resist is removed from the top surface using a dry-cleaning or wet-cleaning process.

In task 540, a query is performed to determine if the wafer will be used to perform a calibration procedure. When the wafer is to be used to perform a calibration procedure, procedure 500 branches to 545. In task 545, a calibration procedure is performed using the wafer. When a calibration procedure is not required, procedure 500 branches to 550. In task 550, the wafer is stored for later use.

In some alternate embodiments, the second material of layer 52 may be deposited using a reticle that defines a pattern with openings having an arrangement similar to patterned layer 52 and through which the second material of layer 52 is deposited on the first material layer 54.

Figure 6:
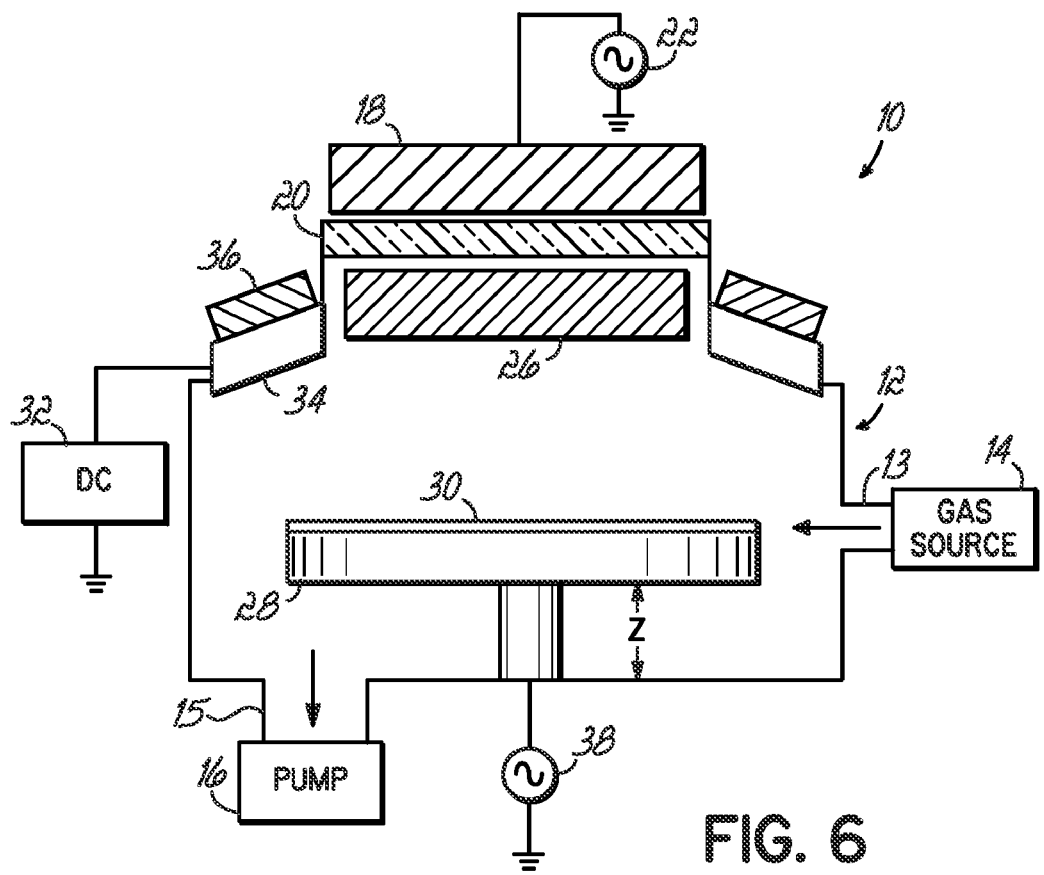
FIG. 6 illustrates a diagrammatic view of processing subsystem in accordance with embodiments of the invention.

With reference to FIG. 6, an ionized physical vapor deposition (IPVD) apparatus 10 illustrates a representative processing subsystem 130 (FIG. 1) in accordance with embodiments of the invention. The ionized physical vapor deposition apparatus 10 includes a vacuum chamber 12 coupled by a gas introduction port 13 with a source 14 of a non-reactive sputtering gas, such as argon, and a pumping port 15 with a vacuum pump 16 that continuously evacuates gases from the vacuum chamber 12 to provide a suitable sub-atmospheric pressure constituted predominately by a partial pressure of the sputtering gas. The pressure inside the vacuum chamber 12 is adjusted to provide an appropriate ionized deposition range for conducting ionized physical vapor deposition. An antenna 18 is positioned outside of the vacuum chamber 12 on a non-vacuum side of a dielectric window 20. A radio-frequency (RF) generator 22 supplies high frequency electrical current to the antenna 18, which is coupled with the process gas inside the vacuum chamber 12 to generate plasma. The dielectric window 20, which forms a portion of the vacuum chamber 12, separates the antenna 18 from the evacuated space inside the vacuum chamber 12. A deposition baffle 26, which is positioned inside of the vacuum chamber 12 in close proximity to the vacuum side of the dielectric window 20, serves to shield the dielectric window 20 from the plasma.

In one embodiment, the ionized physical vapor deposition apparatus 10 may include a segmented biased device. Exemplary segmented biased devices are disclosed in co-pending U.S. patent application Ser. No. 11/196,557; the disclosure of which is incorporated by reference herein in its entirety. Alternatively, other biasing arrangements may be used.

A temperature-controlled chuck 28 supports a semiconductor wafer 30 at a location inside the vacuum chamber 12 suitable to expose the wafer 30 to ions accelerated from the plasma. In addition, the temperature-controlled chuck 28 may be vertically translated before, during, and/or after a process is perform. A direct current (DC) power supply 32 is electrically coupled with a target 34 for DC biasing the target 34 relative to the grounded vacuum chamber 12. A permanent magnet pack 36 is located behind the target 34 to produce a magnetic tunnel over the target 34 sufficient for magnetron sputtering. The power levels of the DC power supply 32 and the RF generator 22 are selected as appropriate for ionized physical vapor deposition. A radio-frequency bias generator 38 is electrically coupled with the chuck 28 and supplies a net negative bias on the wafer 30 during deposition, which accelerates sputtered target atoms that are ionized from the plasma toward the semiconductor wafer 30.

Figure 7:
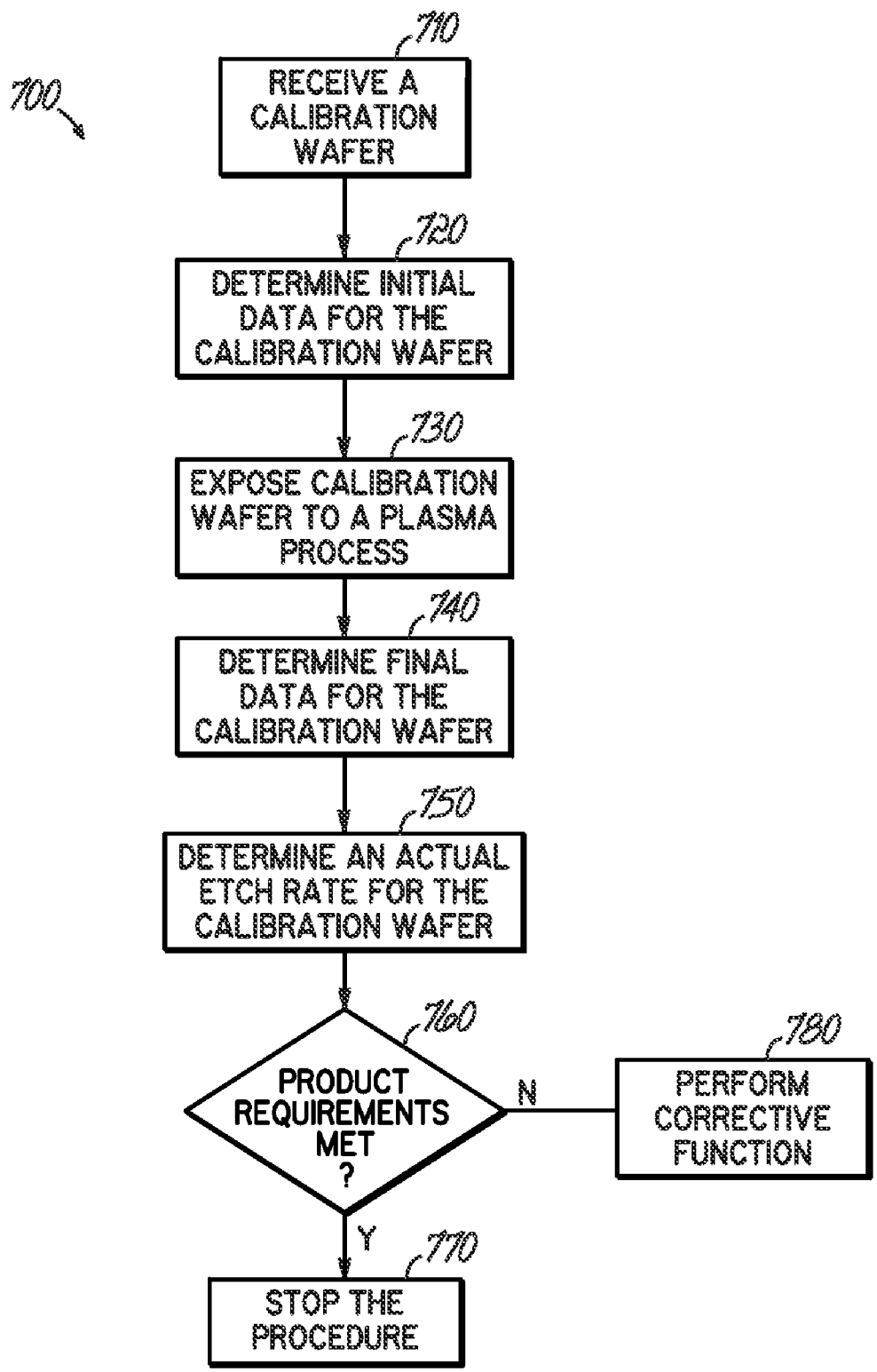
FIG. 7 illustrates an exemplary flow diagram for a method of using a calibration wafer in accordance with embodiments of the invention.

FIG. 7 illustrates an exemplary flow diagram for a method of using calibration wafer 50 (FIGS. 2, 3) in accordance with an embodiment of the invention. In the illustrated embodiment, a procedure 700 is illustrated for determining an actual etch rate for a plasma process using a calibration wafer. In addition, a redeposition rate and/or an apparent etch rate may be determined for a plasma process using the calibration wafer 50. In alternative embodiments, any of the calibration wafers described herein may be used for determining an actual etch rate, as described hereinbelow with regard to calibration wafer 50.

In task 710, calibration wafer 50 is received by a processing system, such as processing system 100 (FIG. 1). For example, calibration wafer 50 may be provided to a transfer subsystem 120 (FIG. 1). The calibration wafer 50 may include one or more selective-redeposition sources 58 that were created by a fabrication process modifying one or more layers of material on a carrier substrate 55. Each selective-redeposition source 58 may be characterized using a surface area, a diameter, a depth, a width, a thickness, a sidewall angle, or an aspect ratio, or a combination thereof. In one embodiment, a minimum separation distance, s, between re-deposition sources is equal to or greater than a thermalization length determined using the characteristics of the plasma process. Alternatively, the minimum separation distance, s, may be less that the thermalization length. In addition, the total area of selective-redeposition sources 58 may be substantially less than a wafer area. In alternate embodiments, a calibration wafer that was manufactured at an earlier time may be provided to the processing system.

When creating the one or more selective-redeposition sources 58 on the calibration wafer, sources 58 can be created with widths of more than approximately 100 nanometers if the resolution of the metrology test is adequate to resolve features with this dimension.

In task 720, an initial set of data can be determined for the wafer 50. An initial thickness of the material within a selective-redeposition source 58 and an initial thickness of the material in a flat field region of layer 52 adjacent the one or more selective-redeposition sources 58 is determined. The initial thickness within each selective-redeposition source 58 may be determined using data created when the calibration wafer 50 was fabricated. Alternatively, the initial thickness of the material within a selective-redeposition source 58 may be measured or calculated. In addition, an initial thickness of the material in a flat field region of layer 52 adjacent the one or more selective-redeposition sources 58 may be determined using data created when the calibration wafer 50 was fabricated. Alternatively, the initial thickness of the material in the flat field region of layer 52 adjacent a selective-redeposition source 58 may be measured or calculated.

After deposition and before the calibration wafer 50 is exposed during the plasma process, the initial thickness of layer 54 in the one or more selective-redeposition sources 58 (FIGS. 1, 2) may be measured using a material selective metrology technique or test. An exemplary material selective metrology test for accurately measuring the layer thickness is X-ray fluorescence (XRF) spectrometer. As understood by a person having ordinary skill in the art, XRF spectrometry is a conventional analytical technique in which a collimated primary beam of polychromatic X-rays is directed at one of the one or more selective-redeposition sources 58 and the energy levels or wavelengths of resultant secondary X-rays emitted by atoms of the second material on and under the surface of the one or more selective-redeposition sources are measured. One category of XRF spectrometry is energy-dispersive XRF (EDXRF) in which the secondary X-ray intensity is collected in a spectrum as a function of detected secondary X-ray photon energy. Another category of XRF spectrometry is wavelength-dispersive XRF (WDXRF), in which the secondary X-rays are dispersed by diffraction into discrete wavelengths and collected in a spectrum of secondary X-ray photon intensity as a function of detected secondary X-ray photon wavelength.

When the metrology test is performed, the collimated primary beam of polychromatic X-rays may be sufficiently small such that the second material of layer 52 in the field region surrounding the selective-redeposition source 58 of the first material is not exposed to the primary X-rays. Specifically, the spot size of the primary X-ray beam may be collimated to have a maximum dimension about 5 mm, which represents a minimum dimension for the one or more selective-redeposition sources 58 of layer 54. The maximum spot size for the primary X-rays is contingent upon the dimensions of the one or more selective-redeposition sources 58 and, in any event, cannot exceed 15 mm, which can represent the maximum allowed dimension for the one or more selective-redeposition sources 58.

After deposition and before the calibration wafer 50 is exposed during the plasma process, the initial thickness of layer 54 in the one or more selective-redeposition sources 58 (FIGS. 1, 2) may be measured using a non-material selective metrology technique or test.

In task 730, the plasma process is performed, and the calibration wafer 50 is exposed to a plasma for a first exposure time so as to redistribute (etch) the material from within the selective-redeposition sources 58 and from the flat field region of layer 52 adjacent the one or more selective-redeposition sources 58. The calibration wafer 50 may be placed inside a vacuum chamber of a plasma processing apparatus, and plasma can be generated inside the vacuum chamber. Alternatively, a deposition/etch process may be performed during the plasma exposure time, and a material may be deposited and/or sputtered in the base portion of the selective-redeposition structures 50 and in the flat field region of layer 52. In one embodiment, the first exposure time may be identical to the time for a plasma process running on a processing subsystem 130 (FIG. 1) in a semiconductor manufacturing facility so as to characterize the process.

When exposed to the plasma and bombarded by the constituent ions of the plasma drawn to the biased calibration wafer 50, the second material of layer 52 (FIGS. 1, 2) will be incrementally eroded by sputtering (i.e., etching) and, similarly, the first material of layer 54 in the one or more selective-redeposition sources 58 will be incrementally eroded by sputtering. Regions of layer 54 covered by layer 52 are protected from plasma exposure and, hence, remain intact during the plasma exposure. The second material differs from the first material constituting layer 54, and this implies that the first and second materials have different sputtering yields. As understood by a person having ordinary skill in the art, the sputtering yield of a material is a conventional measure of the efficiency of the sputtering process for removing atoms of the material from a layer.

The presence of layer 52 of the second material and the partial masking of layer 54 that is used to create the selective-redeposition sources 58 significantly reduces redeposition of atoms of the first material in the selective-redeposition sources 58. However, the second material sputtered from layer 52 tends to redeposit on the selective-redeposition sources 58.

In task 740, a final set of data can be determined for the calibration wafer 50. A final thickness of the material within the one or more selective-redeposition sources 58 and a final thickness of the material in the flat field region adjacent the one or more selective-redeposition sources is determined. The final thickness within a selective-redeposition source 58 may be determined using data generated when the plasma process was performed on the calibration wafer. Alternatively, the final thickness of the material within the one or more selective-redeposition sources 58 may be measured or calculated. In addition, the final thickness of the material in the flat field region may be determined using data generated when the plasma process was performed on the calibration wafer 50. Alternatively, the final thickness of the material in the flat field region may be measured or calculated. The final thickness of the material in the selective-redeposition sources 58 may be determined, for example, either using a thickness profiler (material insensitive metrology) or an XRF (material sensitive or material insensitive metrology) metrology tool.

For example, a material-selective metrology test (e.g., XRF spectrometry) may be performed on the calibration wafer 50 to determine the post-sputtering thickness of layer 54 in the selective-redeposition sources 58. XRF spectrometry resolves different elements based upon the dependence of the energy or wavelength of the secondary X-rays on the atomic number of the specific fluorescing element. Different materials fluoresce at different energies or wavelengths. For example, copper fluoresces at an energy level of approximately 8.047 keV and tantalum fluoresces at an energy level of approximately 8.145 keV. Energy-resolving or wavelength-resolving detectors are used to collect and detect the different energy levels or wavelengths at which the secondary X-rays are fluoresced for use in building an energy or wavelength spectrum of the detected secondary X-rays. From the energy or wavelength spectrum, the element or elements producing the secondary X-rays may be identified.

In task 750, an actual etch rate can be determined. The post-sputtering thickness, which is determined from the metrology test, is compared with the pre-sputtering or original thickness of the layer 54 in the selective-redeposition sources 58. Specifically, the actual etch rate of the first material of layer 54 is equal to a quotient having a numerator equal to the difference in the original thickness and the post-sputtering thickness of layer 54 and a denominator equal to the exposure time for the calibration wafer 50 during the plasma process. The apparent etch rate for the first material in layer 54 may be determined by comparing the change in thickness of a uniformly thick layer of the first material exposed during a plasma process for an equivalent plasma exposure time. To that end, a semiconductor wafer 30 bearing a layer (not shown) of the first material constituting layer 54 and having a known layer thickness may be placed in the vacuum chamber 12 of the ionized physical vapor deposition apparatus 10. A timed process is performed with the semiconductor wafer 30 exposed to the plasma. The exposure time may be identical to the exposure time for the calibration wafer 50 or may differ. The final thickness of the layer of the first material is measured and the etch rate is determined from the initial thickness, final thickness, and plasma exposure time. The measured or apparent etch rate for the layer of the first material is less than the actual etch because of redeposited atoms of the first material.

The peak height or peak area for the secondary X-rays characteristic of the material of layer 52 may be used to determine the post-sputtering thickness of the first material of layer 54 in the selective-redeposition sources 58 as understood by a person having ordinary skill in the art. The peak for the secondary X-rays characteristic of the second material of layer 52 that has redeposited in the selective-redeposition sources 58 is sufficiently shifted in the energy or wavelength spectrum of the metrology test such that the redeposited second material of layer 52 in selective-redeposition sources 58 does not affect the determination of the post-sputter thickness of the first material of layer 54 in selective-redeposition sources 58.

The one or more selective-redeposition sources 58 of the first material of layer 54 may be positioned and dimensioned with a separation distance, s, such that atoms of the constituent first material eroded from the one or more selective-redeposition sources 58 have a low probability of redepositing on the originating selective-redeposition source 58 or on any of the adjacent selective-redeposition sources 58. The exposed surface 59 of each individual selective-redeposition source 58 of the first material in layer 54 may be of any suitable closed geometrical shape, such as circular, square or rectangular, although illustrated as circular, having a closed perimeter. The one or more selective-redeposition sources 58 of the first material may be disposed along a diameter of the calibration wafer 50, as depicted in FIG. 2. This linear alignment crossing through the center of the calibration wafer 50 may advantageously facilitate a determination of the radial dependence of the actual etch rate for the first material of layer 54 during the plasma process.

The redeposition rate of the first material is proportional to the separation distance, s, between adjacent selective-redeposition sources 58 and is also proportional to the surface area of each selective-redeposition source 58. As the separation distance, s, increases and/or the surface area decreases, the likelihood is reduced that first material sputtered from one selective-redeposition source 58 will redeposit on other adjacent selective-redeposition sources 58. Advantageously, the separation distance, s, between adjacent selective-redeposition sources 58 of layer 54 may be greater than, or equal to, the thermalization length for atoms of the first material sputtered from the one or more selective-redeposition sources 58 during plasma exposure, which is believed to greatly reduce the likelihood of redeposition for the first material.

The redeposition of the first material of layer 54 can be optimized by controlling the size and/or arrangement of the selective-redeposition sources 58, and sputtered atoms of the second material from layer 52 can be redeposited on the one or more selective-redeposition sources 58 while the calibration wafer 50 is exposed to the plasma during the plasma process. The second material originating from layer 52 may be combined with, or form a layer on, the first material of layer 54 in the one or more selective-redeposition sources 58 as there is no restriction on redeposition of the second material of layer 52. However, the contribution of the redeposition of the second material from layer 52 in the one or more selective-redeposition sources 58 may be controlled by controlling the etch rate of the second material from layer 52. In particular, the contribution from the etch rate of the second material of layer 52 may be negligible in determining the actual etch rate of the first material of layer 54 in the selective redeposition sources 58. The amount of first material and/or the amount of the second material in the one or more selective-redeposition sources 58 may be determined by the metrology test.

The maximum dimension of each of the selective-redeposition sources 58 of the first material may be less than about 15 mm, which is believed to represent a thermalization length at an operating pressure greater than about 30 mTorr in the ionized physical vapor deposition apparatus 10. Although not wishing to be limited by theory, this size for the selective-redeposition sources 58 is believed to provide a redeposition rate for the first material of less than 0.5 percent. In one embodiment, the minimum dimension of each selective-redeposition source 58 can be determined using a spatial resolution of a metrology tool/test. For example, the minimum and maximum dimension for a circular selective-redeposition source 58 can set a range for the diameter of the bounding circle. As another example, a polygonal selective-redeposition source 58 can comprises straight line segments that enclose and bound the selective-redeposition source 58, which will have a centroid. The length of a line connecting any two points on the line segments and passing through the centroid will vary depending upon the location of the two points. For example, a square selective-redeposition source 58 will have a diagonal line that is longer than any other line connecting two points on the bounding peripheral line segments and passing through the centroid of the square that are not vertices of the square.

The invention contemplates that a single selective-redeposition source 58 of the first material may be located at any location along a diameter of calibration wafer 50, rather than a plurality of selective-redeposition sources 58 disposed at a corresponding plurality of locations. The actual etch rate may be determined from the single selective-redeposition source 58 with a possible disadvantage in that a statistical average of the actual etch rate of the first material and spatial information (i.e., radial dependence of the actual etch rate) is absent.

In task 760, a query is performed to determine if the actual etch rate ($R_{actual}$), the first amount of the first material, the second amount of the second material, or the first exposure time, or a combination thereof is less than or equal to a product requirement. Procedure 700 can branch to task 770 if the actual etch rate ($R_{actual}$), the first amount of the first material, the second amount of the second material, or the first exposure time, or a combination thereof is less than or equal to a product requirement, and procedure 700 can branch to 780 if actual etch rate ($R_{actual}$), the first amount of the first material, the second amount of the second material, or the first exposure time, or a combination thereof is not less than or equal to a product requirement.

In task 770, the determining of the actual etch rate process can be stopped if the product requirement is met.

In task 780, a corrective action can be applied if the product requirement is not met.

Although not wishing to be bound by theory, the actual etch rate and redeposition may be mathematically modeled with certain simplifying assumptions. Ions from the plasma arriving at the surface of the calibration wafer 50 sputter the first material from the selective-redeposition sources 58 at an actual or absolute sputter-etch rate $R_{etch(absolute)}^{unmasked\_area}$ (x, y). The total number of re-sputtered atoms per second from the $k^{-th}$ selective-redeposition source 58 having a radius $r_{mask}$ is given by:

$$n_k^{unmasked\_material}(total) \approx R_{k[etch(absolute)]}^{unmasked\_area}(x_k, y_k) A/V$$

The area of the $k^{-th}$ spot is $A = \pi r_{mask}^2$ for a circular selective-redeposition source 58 and the parameter V represents a volume of a single atom of the first material sputtered from the surface of the selective-redeposition source 58.

Sputtered atoms of the first material are ejected from the selective-redeposition sources 58 by plasma exposure into a space above the calibration wafer 50 and are subsequently thermalized at an average distance from the wafer surface referred to as the thermalization length $r_{therm}$, which may be approximated by:

$$r_{therm}(p) \approx \bar{\lambda}(p) \times [(1/\log 2) \times \log(1 + E_{eject}/E_{therm})]$$

Approximating the mean free path as $\bar{\lambda}(mm) \approx 88/p(mTorr)$, the thermalization length becomes:

$$r_{therm}(mm) \approx 440/p(mTorr)$$

The consequence of the ejection and thermalization is a generation of the volume density of atoms of the first material of layer 54 in the space inside the vacuum chamber 12 above the calibration wafer 50. The localization of the first material sputtered from the selective-redeposition sources 58 may be represented by a normalized sputtered material density distribution within a planar disk above a circular spot with a center point $(x_k, y_k)$ at distance $r_{therm}$ as:

$$n_{k(therm)}^{unmasked\_material}(x,y,x_k,y_k) = C_{k,0} f_{k(therm)}(x,y,x_k,y_k)|_{z=r_{therm}}$$

in which the distribution function is given by:

$$f_{k(therm)}(x, y, x_k, y_k)|_{z=r_{therm}} = \ldots = \frac{1 + (tg\varphi)^2}{2(tg\varphi)^2} \times$$

$$\left\{ 1 - \frac{1 + \frac{(x-x_k)^2 + (y-y_k)^2 - (tg\varphi)^2}{r_{therm}^2}}{\sqrt{\left[1 - \frac{(x-x_k)^2+(y-y_k)^2}{r_{therm}^2} + (tg\varphi)^2\right]^2 + 4\frac{(x-x_k)^2(y-y_k)^2}{r_{therm}^2}}} \right\}$$

and a trigonometric function is defined by $tg\phi = r_{mask}/r_{therm}$. The constant $C_{k,0}$ is determined from a condition that all sputtered first material from the circular selective-redeposition source 58 is ejected into a planar disk source above the calibration wafer 50 as:

$$C_{k,0} = \frac{\pi r_{mask}^2 R_{k[etch(absolute)]}^{unmasked\_area}(x_k, y_k)}{V \int_{-r_w}^{r_w} \int_{-\sqrt{r_w^2-x^2}}^{\sqrt{r_w^2-x^2}} f_{k(therm)}(x, y, x_k, y_k)\Big|_{z=r_{therm}} dx\, dy}$$

The integral may be solved either analytically or numerically.

Because the sputtered atoms of the first material from the selective-redeposition sources 58 are scattered in collisions with the background gas in the vacuum chamber 12, the first material is, after thermalization, redistributed by diffusion and deposited back on the calibration wafer 50 into a redeposition area on the surface of wafer 50 that circumscribes the originating selective-redeposition source 58. The radius of a redeposition area depends on an actual pressure during the plasma process, which in turn determines the thermalization length. The redeposition contribution of the first material ($\alpha$) from an arbitrary area is given by:

$$R_{\alpha A}(redep) \equiv R_{j(redep)}^{\substack{unmasked\_material \\ in\ unmasked\ area}}(x_j, y_j) = \frac{3.75 V}{4\pi v_{therm}} \exp\left\{-3.75 \frac{r_{therm}}{v_{therm}}\right\} \times$$

$$\ldots \times \int_{-r_{wall}}^{r_{wall}} \int_{-\sqrt{r_{wall}^2 - x^2}}^{\sqrt{r_{wall}^2 - x^2}} \frac{\sum_{k=1}^{n_k} C_{k,0} f_{f(therm)}(\xi, \eta, x_k, y_k)\Big|_{z=r_{therm}}}{[(x_j - \xi)^2 + (y_j - \eta)^2 + r_{therm}^2]^{3/2}}$$

$$\exp\left\{-3.75 \frac{(x_j - \xi)^2 + (y_j - \eta)^2}{r_{therm} v_{therm}}\right\} d\xi\, d\eta$$

According to the principles of the invention, there is an arbitrary selectivity between the first and second materials and, typically, the sputtering etch process is characterized by a low selectivity for the etch rate such that $R_{sputter-etch}$(second material) $\cong R_{sputter-etch}$(first material). Sputtered atoms of the second material from layer 52 redistribute to the arbitrary area on the wafer surface and redeposit in the selective-redeposition sources 58. As a result, the selective-redeposition sources 58 will accumulate a deposited layer consisting of a mixture of the first and second materials.

A numerical value characterizing the redeposition of the second material in an arbitrary selective-redeposition source 58 may be estimated by a calculation similar to the calculation estimating the redeposition of the first material in the selective-redeposition source 58. The redeposition of the second material $$R_{\beta B(redep)}^{\substack{whole \\ wafer}}$$

from layer 52 across the entire exposed surface of wafer 50 into a spot "j" (assuming for purposes of the calculation that the wafer 50 is fully masked by the second material ($\beta$) of layer 52) is given by relationship:

$$R_{\beta B(whole\_wafer)}(redep) \equiv R_{j(redep)}^{\substack{mask\_material \\ from\_whole\_wafer\_area}}(x = x_j, y = y_j) =$$

-continued $$\frac{3.75V}{4\pi v_{therm}}\exp\left\{-3.75\frac{r_{therm}}{v_{therm}}\right\}\times\ldots\iint_{wafer}$$

$$\frac{n^{mask\_area}_{whole\_wafer(therm)}(\xi,\eta)}{[(\xi-x)^2+(\eta-y)^2+r^2_{therm}]^{3/2}}\exp\left\{-3.75\frac{(\xi-x)^2+(\eta-y)^2}{v_{therm}r_{therm}}\right\}d\xi d\eta$$

The amount of redeposited first material ($\alpha$) is subtracted from the amount of redeposited second material ($\beta$) to yield:

$$R_{\beta A}(redep) \equiv R_{\beta B(whole\_wafer)}(redep) - R_{\alpha A}(redep) \equiv$$

$$\ldots \equiv R^{mask\_material}_{j(redep)}\left(x|_{x=x_j}, y|_{y=y_j}\right) =$$

$$\frac{3.75V}{4\pi v_{therm}}\exp\left\{-3.75\frac{r_{therm}}{v_{therm}}\right\}\times\ldots\times\iint_{wafer}\frac{n^{mask\_area}_{whole\_wafer(therm)}(\xi,\eta)}{[(\xi-x)^2+(\eta-y)^2+r^2_{therm}]^{3/2}}$$

$$\exp\left\{-3.75\frac{(\xi-x)^2+(\eta-y)^2}{v_{therm}r_{therm}}\right\}\Bigg|_{\substack{x=x_j\\y=y_j}}d\xi d\eta - \ldots - \frac{3.75V}{4\pi v_{therm}}\exp$$

$$\left\{-3.75\frac{r_{therm}}{v_{therm}}\right\}\times\ldots\times\iint_{\substack{unmasked\\area}}\frac{\sum_{k=1}^{n_k}C_{k,0}f_{f(therm)}(\xi,\eta,x_k,y_k)\Big|_{z=r_{therm}}}{[(x_j-\xi)^2+(y_j-\eta)^2+r^2_{therm}]^{3/2}}$$

$$\exp\left\{3.75\frac{(x_j-\xi)^2+(y_j-\eta)^2}{r_{therm}v_{therm}}\right\}d\xi d\eta$$

Using a simplifying assumption that the first material in the selective-redeposition sources 58 and the second material in layer 52 are uniformly distributed across the surface area of the wafer 50 so that the redeposition from the plasma etching process redistributes both materials in equivalent amounts, that is $$R^{masking\_material}_{\substack{unmasked\_area\\(redep)}}(x_j,y_j)\cong R^{masking\_material}_{\substack{unmasked\_area\\(redep)}}(x\neq x_j, y\neq y_j)$$

this relationship may be further simplified to:

$$R_{\beta A}(redep)\equiv R^{mask\_material}_{\substack{mask\_area\\j(redep)}}(x_j,y_j) = \frac{3.75V}{4\pi v_{therm}}\exp\left\{-3.75\frac{r_{therm}}{v_{therm}}\right\}\times\ldots\times$$

$$\iint_{wafer}\left(\frac{n^{mask\_area}_{whole\_wafer(therm)}(\xi,\eta) - \sum_{k=1}^{n_k}C_{k,0}f_{k(therm)}(\xi,\eta,x_k,y_k)|_{z=r_{therm}}}{[(\xi-x_j)^2+(\eta-y_j)^2+r^2_{therm}]^{3/2}}\right.$$

$$\left.\exp\left\{-3.75\frac{(\xi-x_j)^2+(\eta-y_j)^2}{v_{therm}r_{therm}}\right\}\Bigg|_{\substack{x=x_j\\y=y_j}}\right)d\xi d\eta$$

In particular and with this simplifying assumption, the arrangement of selective-redeposition sources 102 (FIG. 10) provides an arrangement in which this relationship holds such that the redeposition into a spot "j" from the layers 52, 54 will be identical because the etch rates are similar [that is $R_{etch}$(first material)$\cong R_{etch}$(second material) or, stated differently, the selectivity is S=$R_{etch}$(first material)/$R_{etch}$(second material)=unity. In this circumstance, the absolute etch rate in each of the selective-redeposition sources 58 is be given by:

$$R^{material\_\alpha}_{\substack{area\_A\\j[etch(absolute)]}}(x_j,y_j)\cong$$

$$R^{material\_\alpha}_{\substack{area\_A\\j[etch(experimental)]}}(x_j,y_j) - R^{material\_\beta}_{\substack{area\_A\\j(redep)}}(x_j,y_j) \text{ or } R^{material\_\alpha}_{\substack{area\_A\\j[etch(absolute)]}}(x_j,y_j)\cong$$

$$R^{material\_\alpha}_{\substack{area\_A\\j[etch(experimental)]}}(x_j,y_j) - R^{material\_\beta}_{\substack{area\_A\\j(redep)}} (x\neq x_j, \neq y_j)$$

Figure 8:
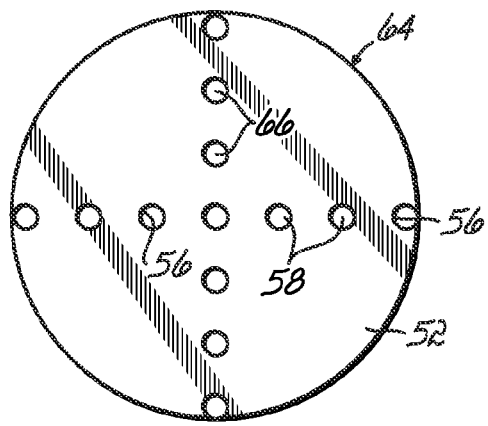
FIGS. 8-13 illustrates exemplary views of alternate embodiments of calibration wafer in accordance with embodiments of the invention.

With reference to FIG. 8, a calibration wafer 64 includes another set of linearly-aligned selective-redeposition sources 66 of the first material in addition to the linearly-aligned selective-redeposition sources 58 on calibration wafer 50. The second line of selective-redeposition sources 66 is aligned along a different diameter of calibration wafer 64 so that selective-redeposition sources 58, 66 are aligned along two different diameters of calibration wafer 64. Portions of the second material of layer 52 cover the remainder of the surface area of the calibration wafer 64. Advantageously, the two lines defining the selective-redeposition sources 58, 66 provide a configuration for use in determining the azimuthal symmetry of the actual etch rate across the surface of the calibration wafer 64. Specifically, the metrology test is used to make a thickness measurement on each of the selective-redeposition sources 58, 66 after plasma exposure, and then, an actual etch rate of the first material is calculated for each of the selective-redeposition sources 58, 66. Layer 52 masks the majority of the surface area of wafer 64, with the exception of the selective-redeposition sources 58, 66 visible through un-masked regions 56.

Figure 9:
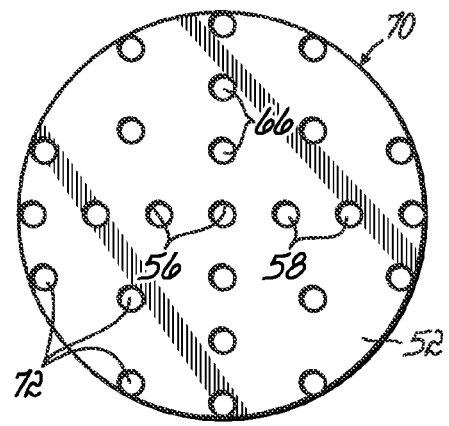

With reference to FIG. 9, a calibration wafer 70 includes a plurality of selective-redeposition sources 72 of the first material in addition to the selective-redeposition sources 58, 66 linearly aligned across the corresponding diameters of calibration wafer 64 (FIG. 5). Portions of the second material of layer 52 cover the remainder of the surface area of the calibration wafer 64. Increasing the number of selective-redeposition sources 58, 66, 72 improves the statistical accuracy in determining an average actual etch rate and also improves the surface mapping of the actual etch rate. Layer 52 masks the majority of the surface area of wafer 70, with the exception of the selective-redeposition sources 58, 66, 72 visible through un-masked regions 56.

Figure 10:
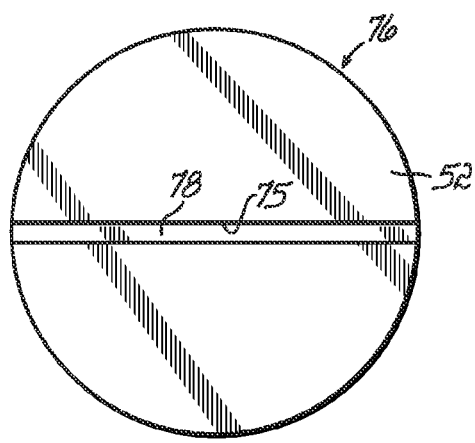

With reference to FIG. 10, a calibration wafer 76 includes a selective-redeposition source 78 of the first material that consists of a continuous line extending across a diameter of the calibration wafer 76 and intersecting the center of the carrier substrate 55 (FIGS. 3, 4) of calibration wafer 76. The line length of the selective-redeposition source 78 may extend between two points on the periphery of the wafer 76 or, alternatively, may be circumscribed on at least one end by the periphery of the wafer 76. The line width for the first material in the selective-redeposition source 78 should be approximately equal to the spatial resolution of the metrology instrument used to perform the metrology test determining the post-sputtering thickness of layer 54 in the selective-redeposition source 78. Portions of the second material of layer 52 cover the remainder of the surface area of the calibration wafer 76 and a linear opening 75 defined in layer 52 exposes the selective-redeposition source 78. The selective-redeposition source 78 of the first material has a line width greater than about 5 mm, which represents the resolution of the metrology test and also represents the width of the linear opening 75. Layer 52 masks the majority of the surface area of wafer 76, with the exception of the selective-redeposition sources 58, 66 visible through linear opening 75.

Figure 11:
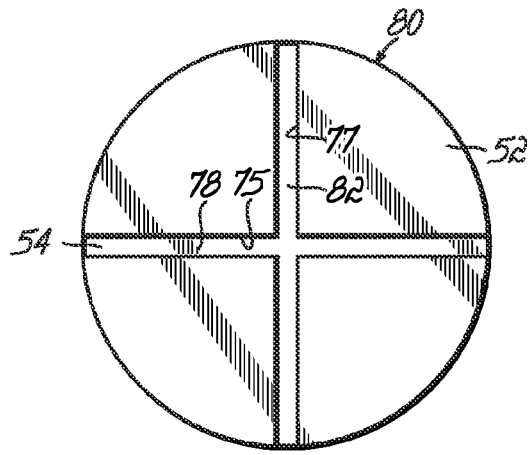

With reference to FIG. 11, a calibration wafer 80 adds a selective-redeposition source 82 of the first material that consists of another continuous line to the configuration of calibration wafer 76 (FIG. 7). However, the selective-redeposition source 82 extends across a different diameter of the calibration wafer 76 than selective-redeposition source 78 and intersects the center of the carrier substrate 55. The line width of each selective-redeposition source 78, 82 should be approximately equal to the spatial resolution of the metrology instrument determining the post-sputtering thickness of layer 54 in the selective-redeposition sources 78, 82. Another linear opening 77 defined in layer 52 exposes the selective-redeposition source 78. The selective-redeposition sources 82 of the first material has a line width greater than about 5 mm, which represents the resolution of the metrology test and also represents the width of the linear opening 77. Layer 52 masks the majority of the surface area of wafer 80, with the exception of the selective-redeposition sources 82 visible through openings linear openings 75, 77.

Figure 12:
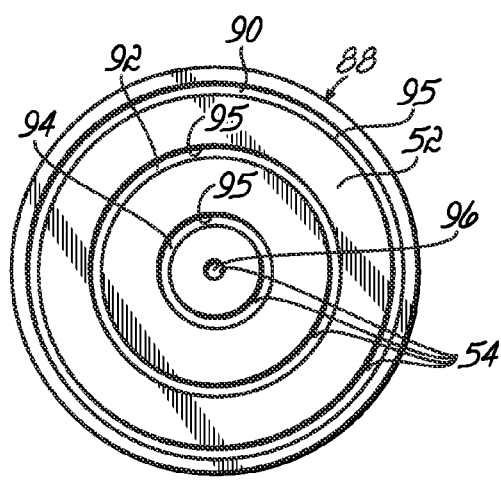

With reference to FIG. 12, a calibration wafer 88 includes a plurality of circular selective-redeposition sources 90, 92, 94 of the first material that are concentrically arranged as rings with adjacent circular portions of layer 52 and encircling a central selective-redeposition source 96 at the center of the carrier substrate 55 (FIGS. 3, 4). Again, the line width of each of the selective-redeposition sources 90, 92, 94 should be approximately equal to the spatial resolution of the metrology instrument determining the post-sputtering thickness of layer 54. The concentric arrangement of the selective-redeposition sources 90, 92, 94, 96 permits a determination of the azimuthal dependence of the actual etch rate of the first material. Annular openings 95 of increasing radius in the second material of layer 52 expose corresponding ones of the selective-redeposition sources 90, 92, 94, while the remainder of the surface area of the calibration wafer 88 is covered or masked by the second material with exception of the central selective-redeposition source 96. The selective-redeposition sources 90, 92, 94 of the first material each have a line width greater than about 5 mm, which represents the resolution of the metrology test and also represents the width of the annular openings 95, while the selective-redeposition source 96 is subject to the same dimensional requirements as selective-redeposition sources 58 (FIG. 2). Layer 52 masks the majority of the surface area of wafer 88, with the exception of the selective-redeposition sources 90, 92, 94 visible through annular openings 95 and selective-redeposition source 96 visible through opening 56.

Figure 13:
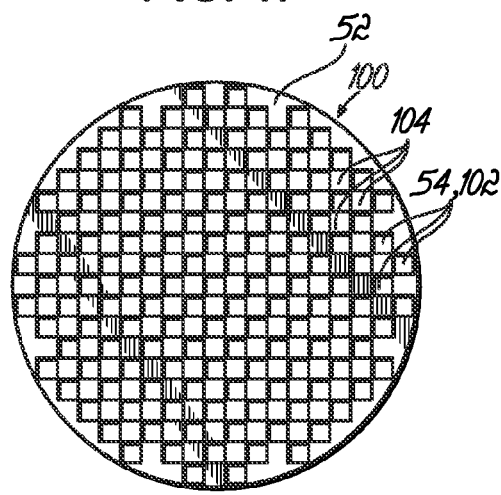

With reference to FIG. 13, a calibration wafer 100 includes a plurality of selective-redeposition sources 102 of the first material that are arranged in a checkerboard pattern with adjacent selective-redeposition sources 102 bordering at corners or vertices. Portions 104 of the second material of layer 52 cover and mask the first material in layer 54 distributed across the remainder of the surface area of the calibration wafer 100. The selective-redeposition sources 102 are subject to the same dimensional requirements as the selective-redeposition sources 58 (FIG. 2).

Preferentially, the minimum separation distance between the adjacent selective-redeposition sources should be at least equal to the thermalization length or larger, but a shorter separation distance than thermalization length is not excluded as well. At the distance shorter than the thermalization length, the redeposition impact is proportional to the ratio $\sim[(\text{spot area})^{1/2}/\text{distance}]$. For example, the separation distance between adjacent selective-redeposition sources that is shorter than four-times the thermalization length will require two-times smaller radius of an unmasked spot radius to maintain the same redeposition effect.

When single strip or multiple strips are used in a calibration wafer, the strip width should be minimized to a minimum value measurable by an applied metrology tool for thickness evaluation in order to reduce the redeposition impact on the error value in the determination of the absolute etch rate.

The number of atoms of the second material sputtered per second from layer 52 may be significantly lower that the number of sputtered atoms of the first material sputtered from layer 54 in the selective-redeposition sources 58 (FIGS. 2, 3) because of the sputtering selectivity between the first and second materials. In this situation, multiple selective-redeposition sources 58 create the planar disk source above the wafer 50 with density described by the relationship:

$$n_{therm}(x, y) = \sum_{k=1}^{n_k} C_{k,0} f_{k(therm)}(x, y, x_k, y_k)\bigg|_{z=r_{therm}}$$

At the thermalization length, the majority of the sputtered atoms of the first material from the selective-redeposition sources 58 are thermalized and undergoing scattering by the background gas atoms in the vacuum chamber 12. A portion of the thermalized atoms of the first material diffuses towards the surface of calibration wafer 50 and can redeposit on the wafer surface. Another portion of the thermalized atoms diffuses away to remote regions of the vacuum chamber 12. The diffusion process may be described by:

$$n = \frac{1}{4\pi D(t-t^0)} \exp\left[-\frac{(\vec{r}-\vec{r}^0)^2}{2D(t-t^0)}\right]$$

The contribution of redeposition in $j^{-th}$ spot on the surface of the calibration wafer 50 from an arbitrary point (x,y) in the overlying disk-shaped redeposition source of sputtered and thermalized atoms of the first material ($\alpha$) may be written as:

$$\Delta R_{\alpha A}(x,y) \equiv R_{j(redep)}(x,y,x_j,y_j) = \frac{3.75}{v_{therm}} \exp\left[-3.75\frac{r_{therm}}{v_{therm}}\right] \times \ldots \times$$
$$\frac{n_{therm}(x,y)}{4\pi[(x_j-x)^2+(y_j-y)^2+r_{therm}^2]^{3/2}} \exp\left[-3.75\frac{(x_j-x)^2+(y_j-y)^2}{r_{therm}v_{therm}}\right]$$

The overall contribution of the redeposition in $j^{-th}$ spot from the entire circular planar source is determined by integrating over the variables (x,y) in the across redeposition source area is $$R_{\alpha A} \equiv R_{j(redep)}(x_j,y_j) = \frac{3.75V}{4\pi v_{therm}} \exp\left\{-3.75\frac{r_{therm}}{v_{therm}}\right\} \times \ldots \times$$

-continued $$\int_{-r_{wall}}^{r_{wall}} \int_{-\sqrt{r_{wall}^2-x^2}}^{\sqrt{r_{wall}^2-x^2}} \frac{\sum_{k=1}^{n_k} C_{k,0} f_{k(therm)}(x, y, x_k, y_k)\Big|_{z=r_{therm}}}{[(x_j - x)^2 + (y_j - y)^2 + r_{therm}^2]^{3/2}}$$

$$\exp\left\{-3.75 \frac{(x_j - x)^2 + (y_j - y)^2}{r_{therm} v_{therm}}\right\} dy dx$$

which represents a relationship describing "j"-spot redeposition of a material sputtered or etched from the number "k" of selective-redeposition sources 58 (each characterized by a radius $r_{mask}$) at an absolute etching rate $R_{etch(absolute)}(x, y)$ and at a chamber pressure p. The experimentally observed etch rate $R_{j[etch(experimental)]}(x_j, y_j)$ in the selective-redeposition sources 58 is related to $R_{j[etch(absolute)]}(x_j, y_j)$ by:

$$-R_{j[etch(experimental)]}(x_j,y_j) = R_{j[etch(absolute)]}(x_j,y_j) + R_{j(redep)}(x_j,y_j)$$

The absolute etch rate may be accurately evaluated for a situation in which $R_{j[etch(absolute)]}(x_j,y_j) \cong R_{j[etch(experimental)]}(x_j,y_j)$ by measuring an experimental etch rate using the calibration wafer 50 with $$R_{j(redep)}(x_j,y_j) \cong 0$$

or, at the least, $$R_{j(redep)}(x_j,y_j) << R_{j[etch(absolute)]}(x_j,y_j) - R_{j[etch(experimental)]}(x_j,y_j)$$

Thus, the effect of redeposition on the measured etch rate may be suppressed over a wide pressure range below a few percent using the calibration wafer 50. This permits an absolute etch rate to be determined with a high degree of accuracy using a single experimental measurement with calibration wafer 50. The redeposition rate may be determined by comparing the absolute or actual etch rate and the experimentally observed etch rate because redeposited atoms of the first material may be ionized in the high-density plasma. The flux of the redeposited first material, either as an ionized flux or as neutral atoms, toward the calibration wafer 50 has an impact on the coverage performance for a deposition process performed on process wafers. Therefore, the calibration wafer 50 permits diagnostics on the process for an immediate evaluation either when process conditions are changed or a new process is developed.

The redeposition on an unmasked wafer may be compared with the redeposition in the exposed areas of the calibration wafer 50 for purposes of determining the suppression of a redeposition and the error of the method. Redeposition is proportional to the exposed area subject to redeposition. The ratio of redeposition for the selective-redeposition sources 58 of the first material on the calibration wafer 50 to the redeposition experienced by an unmasked layer of the first material is approximated by:

$$\frac{R_{j(redep)}}{R_{waf(redep)}} \approx \left(\frac{r_{mask}}{r_{waf}}\right)^2$$

If only one selective-redeposition source 58 is present, k is equal to 1. It is apparent that the redeposition can be significantly reduced if the selective-redeposition source has a small area. For example, the redeposition is less than 10% if the radius $r_{mask} \leq 50$ mm (or $r_{mask}/r_{wafer} \leq 0.3$). Further reducing the size of the selective-redeposition sources to, for example, $r_{mask} \approx 5$ mm to 10 mm (or $r_{mask}/r_{wafer} \approx 0.033$-$0.066$) reduces redeposition to 0.1 percent to 0.5 percent of the redeposition for the unmasked layer of the first material on a wafer. Redeposition rates of this magnitude permit an accurate determination of the absolute etch rate. However, adjacent selective-redeposition sources 58 should be separated by a minimum separation distance that is greater than the thermalization length to avoid a superimposition of the redeposited material from two neighboring selective-redeposition sources.

Figure 14:
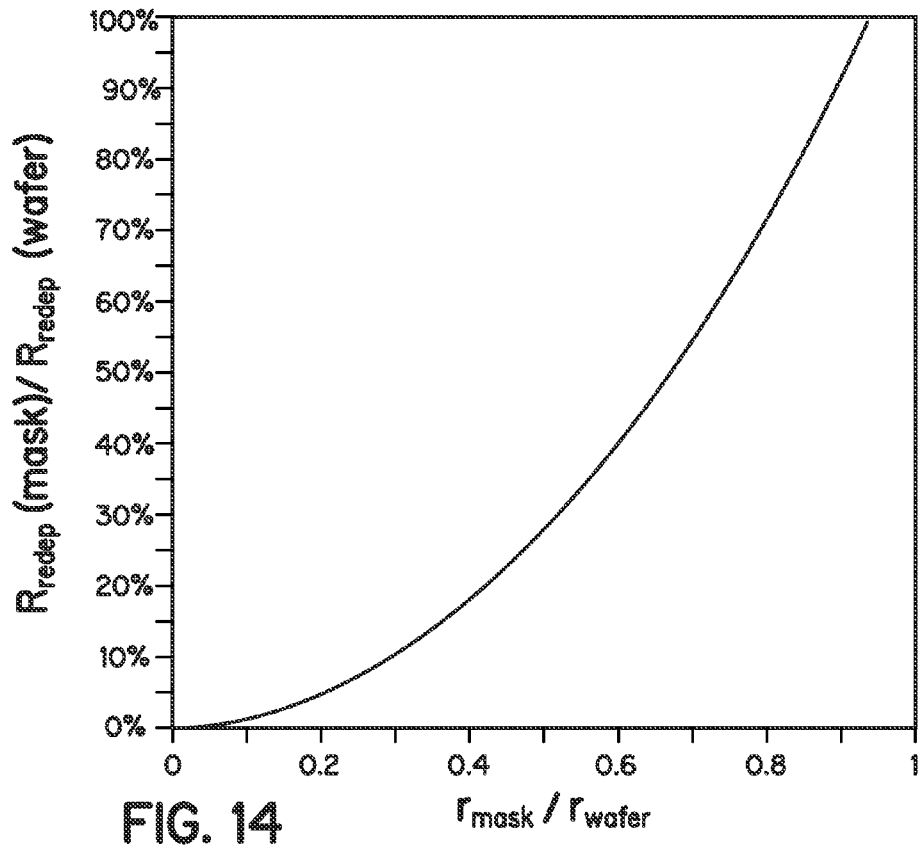
FIG. 14 illustrates an exemplary graph of a redeposition ratio in accordance with the invention.

FIG. 14 illustrates an exemplary graph of a redeposition ratio in accordance with the invention. The graph shows a redeposition ratio $[(R_{redep}(\text{mask})/R_{redep}(\text{wafer})]$ in percent versus the $(r_{mask}/r_{wafer})$ ratio. $R_{redep}(\text{mask})$ can be the amount of redeposition in the one or more selective redeposition sources and $R_{redep}(\text{wafer})$ can be the amount of redepositon for the wafer. In addition, $r_{mask}$ can be the radius of the selective redeposition source and $r_{wafer}$ can be the radius of the calibration wafer.

Figure 15:
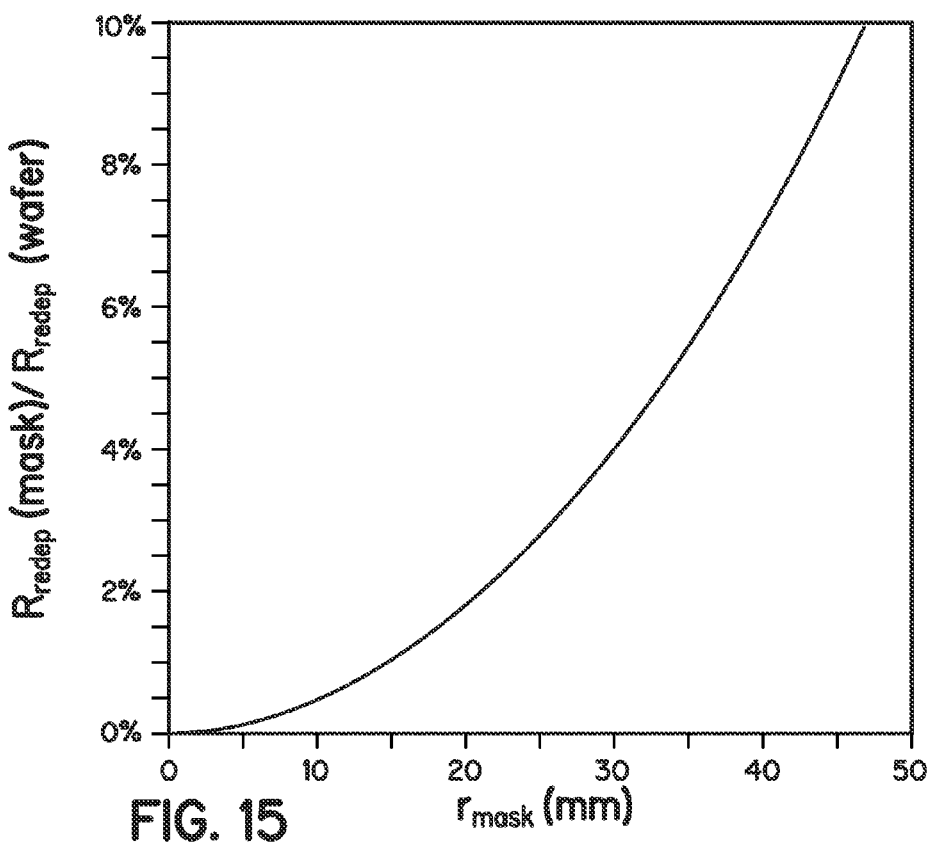
FIG. 15 illustrates another exemplary graph of a redeposition ratio in accordance with the invention.

FIG. 15 illustrates another exemplary graph of a redeposition ratio in accordance with the invention. The graph shows a redeposition ratio $[(R_{redep}(\text{mask})/R_{redep}(\text{wafer}))]$ in percent versus the $(r_{mask})$ measured in millimeters where $r_{mask}$ can be the radius of the selective redeposition source and $r_{wafer}$ can be the radius of the calibration wafer.

Figure 16:
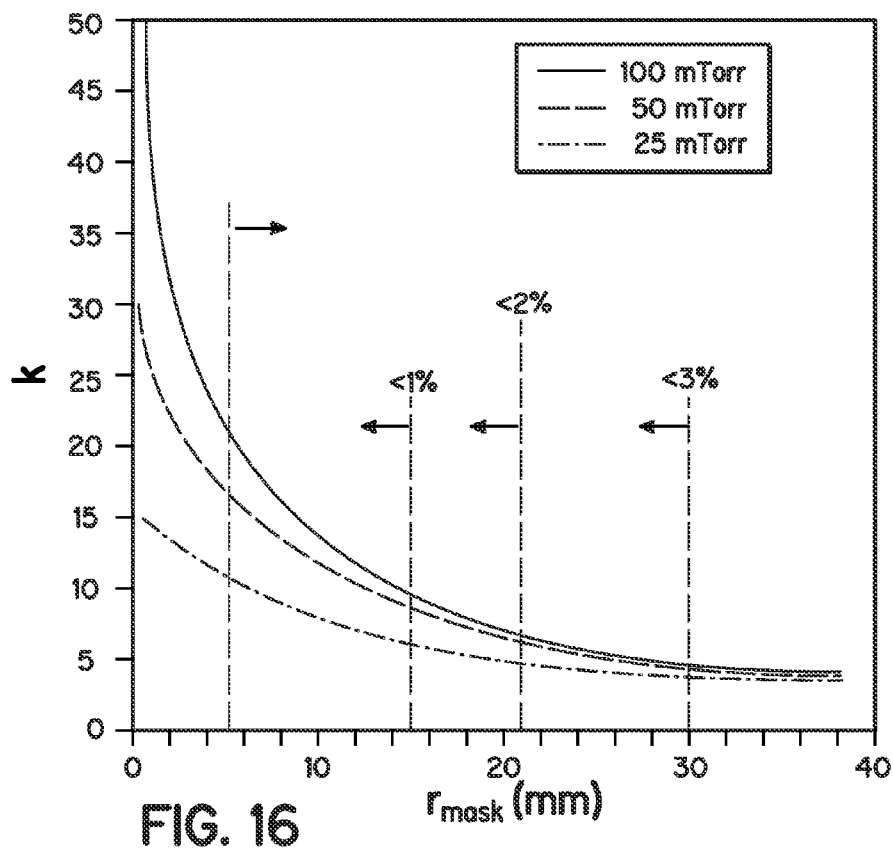
FIG. 16 illustrates an exemplary graph of redeposition amounts in accordance with the invention.

FIG. 16 illustrates an exemplary graph of redeposition amounts in accordance with the invention. The y-axis for the graph shows the number of selective-redeposition sources and the x-axis shows $(r_{mask})$ measured in millimeters where $r_{mask}$ can be the radius of the selective redeposition source. Data is shown for three different pressures 25 mTorr, 50 mTorr, and 100 mTorr. Limits lines are also shown <1%, <2%, and <3%.

Figure 17:
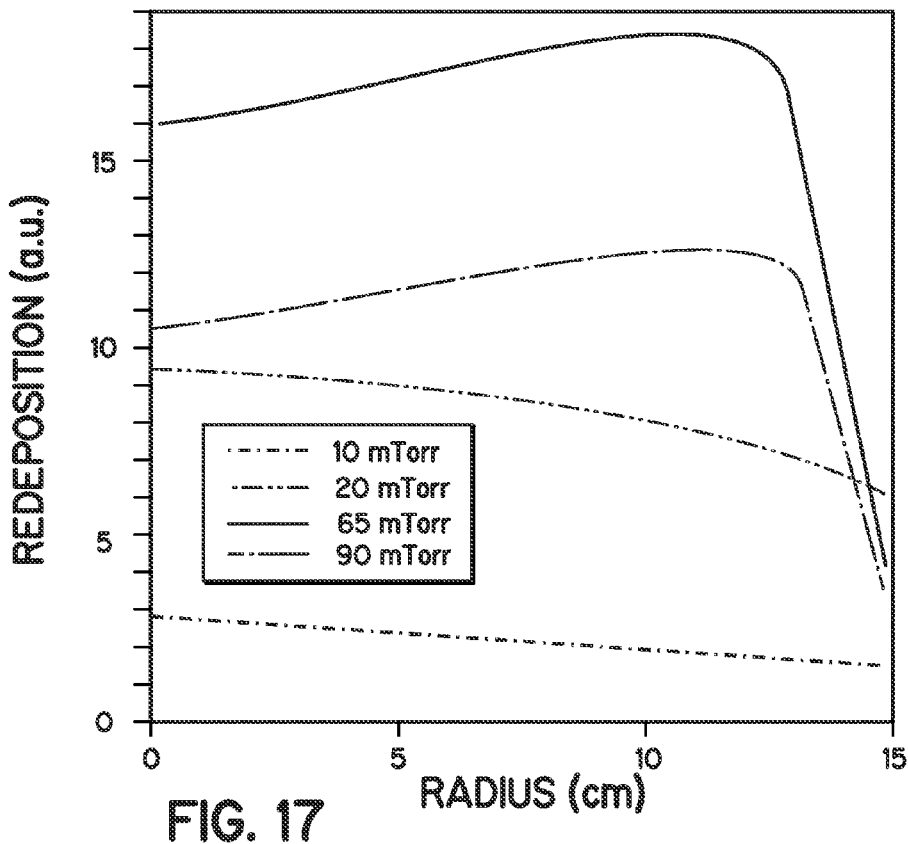
FIG. 17 illustrates another exemplary graph of redeposition amounts in accordance with the invention.

FIG. 17 illustrates another exemplary graph of redeposition amounts in accordance with the invention. The y-axis for the graph shows the redeposition amount (a.u.) number of selective-redeposition sources and the x-axis shows $(r_{mask})$ measured in centimeters where $r_{mask}$ can be the radius of the selective redeposition source. Data is shown for four different pressures 10 mTorr, 20 mTorr, 65 mTorr, and 90 mTorr.

Figure 18:
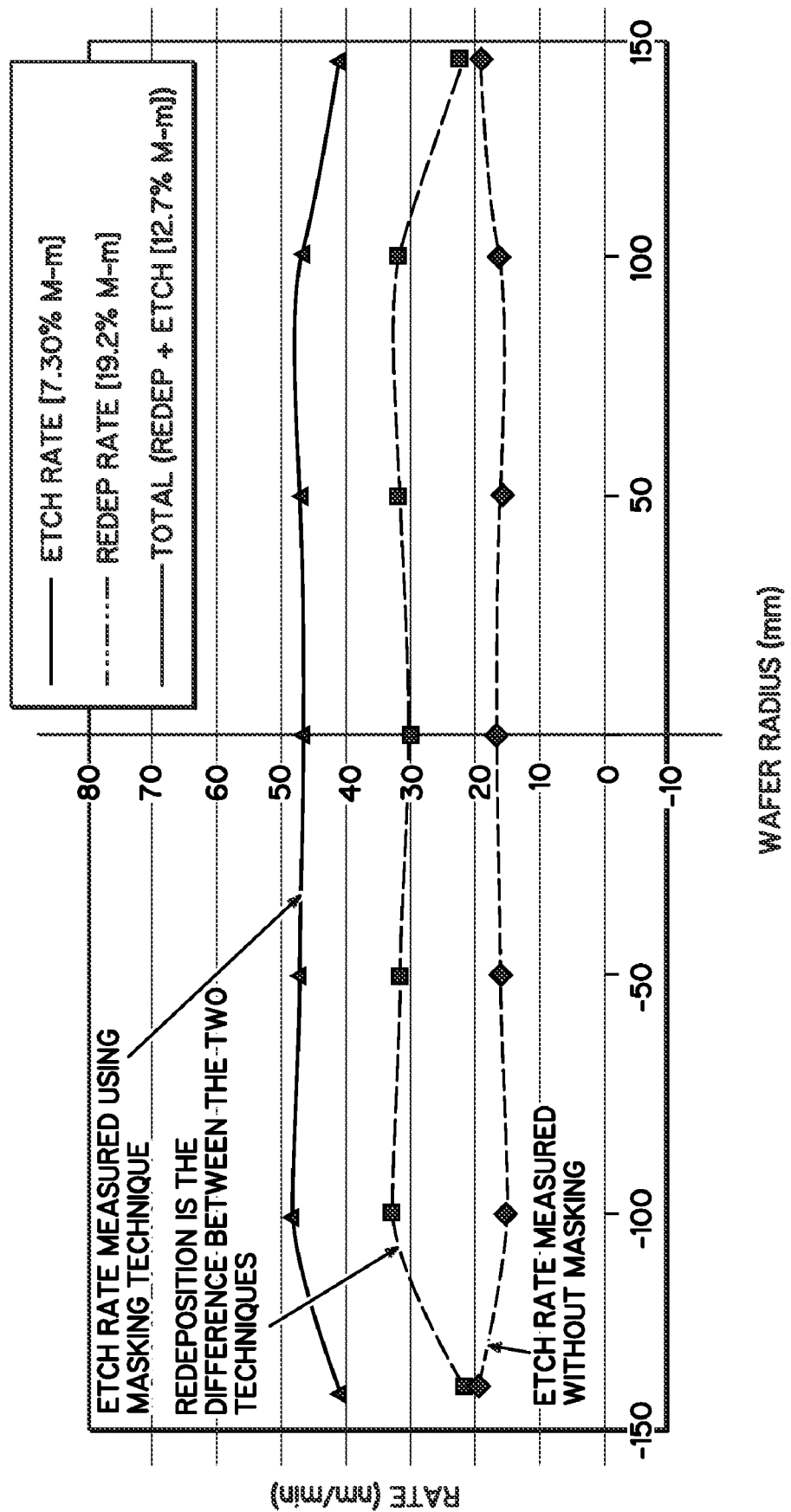
FIG. 18 illustrates an exemplary graph of an etching performance in accordance with the invention.

FIG. 18 illustrates an exemplary graph of the etch performance at a first pressure in accordance with the invention. The y-axis for the graph shows the rate in nanometers/minute and the x-axis shows the wafer radius measured in millimeters. Data is shown for an etch rate measured using masking techniques, an etch rate measured without masking, and redeposition rate. The first pressure is 65 mTorr and the material being used is copper.

While the invention is described in terms of use of the inventive calibration wafers with an ionized physical vapor deposition apparatus 10 (FIG. 6), a person having ordinary skill in the art will comprehend and appreciate that the principles of the invention are application for determining an actual etch rate and redeposition rate in other types of plasma processing tools, such as dry etchers. In addition, for any of the calibration wafers 64, 70, 76, 80, 88, and 100, the first and second materials may be exchanged in a manner similar to the exchange of layers 52, 54 described with regard to FIGS. 3 and 4.

The embodiments described above may be further appreciated in light of the following example.

Example 1

In a laboratory experiment, a test wafer with a diameter of 300 mm was provided with seven unmasked circular exposed surfaces each having a radius of about 20 mm. The exposed surfaces were aligned with x and y axes of the wafer surface and were separated by about 47 mm. The etchable material of the exposed surfaces was copper. The material selected for the masking layer was Ta. The unmasked structure was created by deposition using a reticle mask. An absolute etch rate was measured for different conditions in an iPVD system and showed good correlation with 2D fluid plasma model simulations.

While the invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. A calibration wafer for determining an actual etch rate of an etchable material, the etchable material capable of redepositing onto the calibration wafer after being etched by a plasma from the calibration wafer, the calibration wafer comprising:
    a carrier substrate;
    a continuous first layer of a first material on the carrier substrate; and
    a patterned second layer of a second material on the first layer, the second layer comprising at least one discrete raised region of the second material bordering at least one discrete recessed region of the first material,
    wherein one of the first and second materials is the etchable material, the etchable material has a number of selective-redeposition sources defined by the at least one discrete raised region or by the at least one discrete recessed region, and a first amount of the etchable material is capable of being etched from each of the selective-redeposition sources upon etching by the plasma,
    wherein the number of selective-redeposition sources, a minimum separation distance between adjacent selective-redeposition sources, and a maximum surface area of each of the selective-redeposition sources are such that a second amount of the etchable material that is capable of being redeposited on each of the selective-redeposition sources, upon etching by the plasma, is less than about three percent of the first amount etched from each of the respective selective-redeposition sources.

2. The calibration wafer of claim 1 wherein the number, the minimum separation distance, and the maximum surface area are such that the second amount is about one-half of one percent of the first amount of less.

3. The calibration wafer of claim 1 wherein the etchable material is the first material, and the selective-redeposition sources are defined by the at least one discrete recessed region.

4. The calibration wafer of claim 1 wherein the etchable material is the second material, and the selective-redeposition sources are defined by the at least one discrete raised region.

5. The calibration wafer of claim 1 wherein the minimum separation distance for at least two of the adjacent selective-redeposition sources is greater than or equal to a thermalization length in the plasma for the etchable material etched from the selective-redeposition sources.

6. The calibration wafer of claim 1 wherein each of the respective selective-redeposition sources is larger than a minimum spatial resolution of a metrology instrument used to measure a third amount of the etchable material remaining after the first amount of the etchable material is etched and the second amount of the etchable material is redeposited.

7. The calibration wafer of claim 1 wherein the first and second materials have different etch rates when etched by the plasma.

8. The calibration wafer of claim 7 wherein the one of the first and second materials comprising the etchable material has a higher etch rate than the other of the first and second materials.

9. The calibration wafer of claim 1 wherein the first and second materials are different materials selected from copper, tantalum, aluminum, nickel, cobalt, ruthenium, gold, silver, or titanium, or a combination thereof.

10. The calibration wafer of claim 1 wherein the one of the first and second materials comprising the etchable material is selected from copper, tantalum, aluminum, nickel, cobalt, ruthenium, gold, silver, or titanium, or a combination thereof, and the other of the first and second materials comprises an oxide, or a nitride, or a combination thereof.

11. The calibration wafer of claim 1 wherein the carrier substrate has a center, and the at least one discrete raised region or the at least one discrete recessed region defining the one or more selective-redeposition sources further comprises a plurality of concentric annular rings of the etchable material arranged about the center of the carrier substrate.

12. The calibration wafer of claim 1 wherein the carrier substrate has a center, and the at least one discrete raised region or the at least one discrete recessed region defining the one or more selective-redeposition sources further comprises at least one line of the etchable material intersecting the center of the carrier substrate.

13. The calibration wafer of claim 1 wherein the at least one discrete raised region or the at least one discrete recessed region defining the one or more selective-redeposition sources further comprises a plurality of closed geometrical features distributed across the carrier substrate.

14. The calibration wafer of claim 13 wherein the carrier substrate has a center, and the closed geometrical features are arranged in at least one row intersecting the center of the carrier substrate.

15. The calibration wafer of claim 13 wherein the at least one discrete raised region and the at least one discrete recessed region are arranged in a checkerboard pattern across the carrier substrate.

16. The calibration wafer of claim 1 wherein a composition of the other of the first and second materials does not include the etchable material.

17. The calibration wafer of claim 1 further comprising:
    comparing the actual etch rate to a product requirement; and
    applying a corrective action to adjust the characteristics of the plasma if the product requirement is not met.

18. A method of fabricating a calibration wafer for use in determining an actual etch rate of an etchable material, the method comprising:
    forming a number of selective-redeposition sources of the etchable material on a carrier substrate, wherein a first amount of the etchable material is capable of being etched by a plasma from each of the selective-redeposition sources and a second amount of the etchable material is capable of redepositing onto each of the selective-redeposition sources while the first amount is etched; and
    selecting a number of the selective-redeposition sources, a minimum separation distance between adjacent selective-redeposition sources, and a maximum surface area of each of the selective-redeposition sources such that the second amount of the etchable material is predicted to be about three percent or less of the first amount.

19. The method of claim 18 wherein forming the selective-redeposition sources further comprises:
selecting first and second materials of which one of the first and second materials is the etchable material for the one or more selective-redeposition sources;
forming a continuous first layer of the first material on a carrier substrate; and
forming a patterned second layer of the second material on the continuous layer, wherein the second layer comprises at least one discrete raised region of the second material bordering at least one discrete recessed region of the first material, and the selective-redeposition sources are defined by the at least one discrete raised region or by the at least one discrete recessed region.

20. The method of claim 19 wherein the etchable material is the first material, and the selective-redeposition sources are defined by the at least one discrete recessed region.

21. The method of claim 19 wherein the etchable material is the second material, and the selective-redeposition sources are defined by the at least one discrete raised region.

22. The method of claim 18 wherein selecting the number of exposed surfaces, the minimum separation distance between adjacent selective-redeposition sources, and the maximum surface area further comprises:
selecting the number, the minimum separation distance, and the maximum surface area such that the second amount is less than about one-half of one percent of the first amount.

23. The method of claim 18 wherein selecting the number of selective-redeposition sources, the minimum separation distance between adjacent selective-redeposition sources, and the maximum surface area further comprises:
selecting the minimum separation distance for at least two of the adjacent selective-redeposition sources to be greater than or equal to a thermalization length in the plasma for the etchable material from the selective-redeposition sources.

24. The method of claim 18 wherein forming the selective-redeposition sources further comprises:
arranging the at least one discrete raised region or the at least one discrete recessed region defining the one or more exposed surfaces as a plurality of closed geometrical features distributed across the carrier substrate.

25. The method of claim 24 wherein the carrier substrate has a center, and arranging the exposed surfaces further comprises:
arranging the closed geometrical features in at least one row intersecting the center of the carrier substrate.

26. The method of claim 18 wherein forming the selective-redeposition sources further comprises:
arranging the at least one discrete raised region and the at least one discrete recessed region in a checkerboard pattern.

27. The method of claim 18 wherein the carrier substrate has a center, and forming the selective-redeposition sources further comprises:
arranging the at least one discrete raised region or the at least one discrete recessed region defining the one or more selective-redeposition sources as a plurality of concentric annular rings of the etchable material arranged about the center of the carrier substrate.

28. The method of claim 18 wherein the carrier substrate has a center, and forming the selective-redeposition sources further comprises:
arranging the at least one discrete raised region or the at least one discrete recessed region defining the one or more selective-redeposition sources as at least one line of the etchable material intersecting the center of the carrier substrate.

29. A method of determining an actual etch rate for an etchable material, the method comprising:
providing a calibration wafer carrying a layer of the etchable material, wherein the layer of the etchable material has a number of selective-redeposition sources, a minimum separation distance between adjacent selective-redeposition sources, and a maximum surface area for each of the selective-redeposition sources;
determining an initial thickness of the layer of the etchable material before etching;
etching a first amount of the etchable material from each of the selective-redeposition sources over a plasma exposure time, wherein the number, the minimum separation distance, and the maximum surface area are such that a second amount of the etchable material that redeposits on each of the respective selective-redeposition sources is less than about three percent of the first amount;
determining a final thickness of the layer of the etchable material underlying at least one of the selective-redeposition sources after etching; and
determining the actual etch rate of the etchable material from the initial and final thicknesses and the plasma exposure time.

30. The method of claim 29 wherein etching the first amount of the etchable material further comprises:
introducing a process gas into the vacuum chamber to establish a chamber pressure greater than about 30 mTorr; and
ionizing the process gas to generate the plasma.

31. The method of claim 29 wherein determining the final thickness further comprises:
irradiating at least one of the selective-redeposition sources with primary X-rays; and
analyzing secondary X-rays leaving each irradiated region to determine the final thickness of the layer of the etchable material.

32. The method of claim 29 further comprising:
measuring an apparent etch rate of another layer of the etchable material on an unmasked wafer; and
subtracting the apparent etch rate from the actual etch rate to determine a redeposition rate for the etchable material.

33. The method of claim 29 wherein determining the final thickness further comprises:
determining the final thickness of the layer of the etchable material underlying a plurality of the selective-redeposition sources after etching; and
determining the actual etch rate of the etchable material in each of the selective-redeposition sources from the initial thickness, the final thickness of the layer underlying each of the selective-redeposition sources, and the plasma exposure time.

34. The method of claim 33 further comprising:
determining a spatial dependence of the actual rate of the etchable material on the calibration wafer from the actual etch rate of the etchable material for each of the selective-redeposition sources.

35. The method of claim 33 further comprising:
determining an azimuthal dependence of the actual rate of the etchable material relative to a center of the calibration wafer from the actual etch rate of the etchable material for each of the selective-redeposition sources.

* * * * *